(12) United States Patent
Chang et al.

(10) Patent No.: US 11,869,574 B2
(45) Date of Patent: Jan. 9, 2024

(54) SEMICONDUCTOR MEMORY DEVICE AND MEMORY SYSTEM INCLUDING THE SAME

(71) Applicant: Samsung Electronics Co., Ltd., Suwon-si (KR)

(72) Inventors: Hojun Chang, Seoul (KR); Hundae Choi, Hwaseong-si (KR)

(73) Assignee: Samsung Electronics Co., Ltd.

(*) Notice: Subject to any disclaimer, the term of this patent is extended or adjusted under 35 U.S.C. 154(b) by 0 days.

(21) Appl. No.: 17/674,908

(22) Filed: Feb. 18, 2022

(65) Prior Publication Data

US 2023/0029968 A1 Feb. 2, 2023

(30) Foreign Application Priority Data

Aug. 2, 2021 (KR) .................. 10-2021-0101291

(51) Int. Cl.
*G11C 11/4076* (2006.01)
*G11C 11/4093* (2006.01)
*H03K 3/017* (2006.01)
*H01L 25/18* (2023.01)
*H01L 25/065* (2023.01)

(52) U.S. Cl.
CPC ...... *G11C 11/4076* (2013.01); *G11C 11/4093* (2013.01); *H03K 3/017* (2013.01); *H01L 25/0657* (2013.01); *H01L 25/18* (2013.01)

(58) Field of Classification Search
CPC ............ G11C 11/4076; G11C 11/4093; G11C 29/023; G11C 29/028; G11C 2207/2254; G11C 7/222; G11C 29/50012; G11C 7/1066; G11C 11/4096; G11C 7/1045; H03K 3/017; H03K 5/1565; H03K 5/05; H03K 5/19; H01L 25/0657; H01L 25/18; H01L 25/0652; H01L 2224/16146; H01L 2225/06565; H01L 2224/13025; H01L 2225/06513; H01L 2225/06517;
(Continued)

(56) References Cited

U.S. PATENT DOCUMENTS 7,840,831 B2   11/2010   Jang
9,369,263 B1    6/2016   Baecher et al.
(Continued)

FOREIGN PATENT DOCUMENTS

| CN | 113056788 A | * | 6/2021 | ......... G11C 11/4072 |
| CN | 113168857 A | * | 7/2021 | ......... G11C 11/4076 |
| KR | 20190093102 A | | 8/2019 | |

*Primary Examiner* — Fernando Hidalgo
(74) *Attorney, Agent, or Firm* — Myers Bigel, P.A.

(57) ABSTRACT

A semiconductor memory device includes a mode register set and a clock correction circuit. The mode register set stores a first control code set. During a duty training interval based on a duty training command, the clock correction circuit may divide the duty training interval into a first interval, a second interval and a third interval which are consecutive, may correct a phase skew of a first clock signal and a third clock signal during the first interval, may correct a phase skew of a second clock signal and a fourth clock signal during the second interval, and may correct a phase skew of the first clock signal and the fourth clock signal during the third interval. The semiconductor memory device may enhance signal integrity of clock signals by correcting duty errors and phase skews of the clock signals having multi-phases during the duty training interval.

20 Claims, 22 Drawing Sheets

(58) Field of Classification Search
CPC . H01L 2924/15311; H01L 2225/06541; H01L 2225/06586
USPC .................................................. 365/233.13
See application file for complete search history.

(56) References Cited

U.S. PATENT DOCUMENTS

| | | |
|---|---|---|
| 10,135,429 B2 | 11/2018 | Adachi |
| 10,923,175 B2 | 2/2021 | Moon et al. |
| 10,937,474 B2 | 3/2021 | Park et al. |
| 2020/0321950 A1 | 10/2020 | Ashtiani et al. |
| 2021/0166749 A1 | 6/2021 | Moon et al. |

\* cited by examiner

620

SEMICONDUCTOR MEMORY DEVICE AND MEMORY SYSTEM INCLUDING THE SAME

CROSS-REFERENCE TO RELATED APPLICATIONS

This application claims the benefit of priority under 35 USC § 119 to Korean Patent Application No. 10-2021-0101291, filed on Aug. 2, 2021, in the Korean Intellectual Property Office, the disclosure of which is incorporated by reference in its entirety herein.

FIELD

The present disclosure relates to memory devices, and more particularly to semiconductor memory devices to perform relocking operation of a clock correction circuit and memory systems including the same.

BACKGROUND

A semiconductor memory device may be classified as a volatile memory device or a nonvolatile memory device. A volatile memory device refers to a memory device that loses data stored therein at power-off. As an example of a volatile memory device, a dynamic random access memory (DRAM) may be used in various devices such as a mobile system, a server, or a graphic device.

A semiconductor memory device may operate in synchronization with a clock applied from an outside or external device. When the externally applied clock is used in the semiconductor memory device, a time delay (or a clock skew) may occur due to an internal circuit of the semiconductor memory device. A circuit may be used to compensate for the time delay and correcting duty error.

SUMMARY

Example embodiments may provide a semiconductor memory device capable of correcting phase skews of multi-phase clock signals while training a duty or duty cycle of a data clock signal.

Example embodiments may provide a memory system including a semiconductor memory device capable of correcting phase skews of multi-phase clock signals while training a duty or duty cycle of a data clock signal.

According to example embodiments, a semiconductor memory device includes a mode register set and a clock correction circuit. The mode register set is configured to store a first control code set received from a memory controller and set an operation mode of the semiconductor memory device. The clock correction circuit is configured to generate first, second, third, and fourth divided clock signals, which have a phase difference of 90 degrees with respect to each other, based on a data clock signal received from the memory controller; generate first, second, third, and fourth adjusted clock signals by adjusting skew of each of the first, second, third, and fourth divided clock signals; and sequentially perform a first duty cycle training to search a second control code set, a second duty cycle training to search a third control code set, and a third duty cycle training to search the first control code set, during a duty training interval based on a duty training command received from the memory controller. The second control code set is associated with the first divided clock signal and the third divided clock signal, the third control code set is associated with the second divided clock signal and the fourth divided clock signal, and the first control code set is associated with the first divided clock signal and the second divided clock signal.

According to example embodiments, a memory system includes a semiconductor memory device and a memory controller configured to control the semiconductor memory device. The memory controller includes a duty controller. The semiconductor memory device includes a mode register set and a clock correction circuit. The mode register set is configured to store a first control code set received from the duty controller, and to set an operation mode of the semiconductor memory device. The clock correction circuit is configured to generate first, second, third, and fourth divided clock signals, which have a phase difference of 90 degrees with respect to each other, based on a data clock signal received from the memory controller; generate first, second, third, and fourth adjusted clock signals by adjusting skew of each of the first, second, third, and fourth divided clock signals; and sequentially perform a first duty cycle training to search a second control code set, a second duty cycle training to search a third control code set, and a third duty cycle training to search the first control code set, during a duty training interval based on a duty training command received from the memory controller. The second control code set is associated with the first divided clock signal and the third divided clock signal, the third control code set is associated with the second divided clock signal and the fourth divided clock signal, and the first control code set is associated with the first divided clock signal and the second divided clock signal.

According to example embodiments, a semiconductor memory device includes a mode register set and a clock correction circuit. The mode register set is configured to store a first control code set received from a memory controller, and to set an operation mode of the semiconductor memory device. The clock correction circuit is configured to generate first, second, third, and fourth divided clock signals, which have a phase difference of 90 degrees with respect to each other, based on a data clock signal received from the memory controller; and sequentially perform a first duty cycle training to search a second control code set, a second duty cycle training to search a third control code set, and a third duty cycle training to search the first control code set, during a duty training interval based on a duty training command received from the memory controller. The second control code set is associated with the first divided clock signal and the third divided clock signal, the third control code set is associated with the second divided clock signal and the fourth divided clock signal and the first control code set is associated with the first divided clock signal and the second divided clock signal. The clock correction circuit includes a training scheduler, a phase skew adjusting circuit, a multi pattern generator, a clock multiplexer, a demultiplexer, a register set and a flip-flop. The training scheduler is configured to divide the duty training interval into a first interval, a second interval, and a third interval, which are consecutive, and to generate training control signals during which a duty training signal based on the duty training command is activated. The phase skew adjusting circuit is configured to generate first, second, third, and fourth adjusted clock signals by adjusting the first, second, third, and fourth divided clock signals during the duty training interval. The multi pattern generator is configured to generate first pattern data during the first interval, second pattern data during the second interval, and third pattern data during the third interval, based on a pattern generation control signal in the training control signals. The clock multiplexer is configured to provide the first adjusted clock signal and the third adjusted clock signal as a first selected clock signal and a second selected clock signal from among the first, second, third, and fourth adjusted clock signals based on the first pattern data during the first interval, provide the second adjusted clock signal and the fourth adjusted clock signal as the first selected clock signal and the second selected clock signal from among the first, second, third, and fourth adjusted clock signals based on the second pattern data during the second interval, and provide the first adjusted clock signal and the second adjusted clock signal as the first selected clock signal and the second selected clock signal from among the first, second, third, and fourth adjusted clock signals based on the third pattern data during the third interval. The duty cycle monitor is configured to monitor duty cycles of the first selected clock signal and the second selected clock signal in each of the first interval, the second interval, and the third interval, and to generate monitoring information based on a result of the monitoring. The demultiplexer is configured to provide the monitoring information to the register set in the first interval, and to provide the monitoring information to the memory controller through the flip-flop in the second interval, based on a first selection signal in the training control signals.

Accordingly, during a duty training interval based on a duty training command from the memory controller, the semiconductor memory device may divide the duty training interval into a first interval, a second interval and a third interval which are consecutive, may correct a phase skew of a first clock signal and a third clock signal during the second interval, may correct a phase skew of a second clock signal and a fourth clock signal during the first interval, and may correct a phase skew of the first clock signal and the second clock signal during the third interval. Therefore, the semiconductor memory device may enhance signal integrity of clock signals by correcting duty errors and phase skews of the clock signals having multi-phases during the duty training interval.

BRIEF DESCRIPTION OF THE DRAWINGS

Example embodiments will be described below in more detail with reference to the accompanying drawings.

DETAILED DESCRIPTION

Various example embodiments will be described more fully hereinafter with reference to the accompanying drawings, in which example embodiments are shown.

Figure 1:
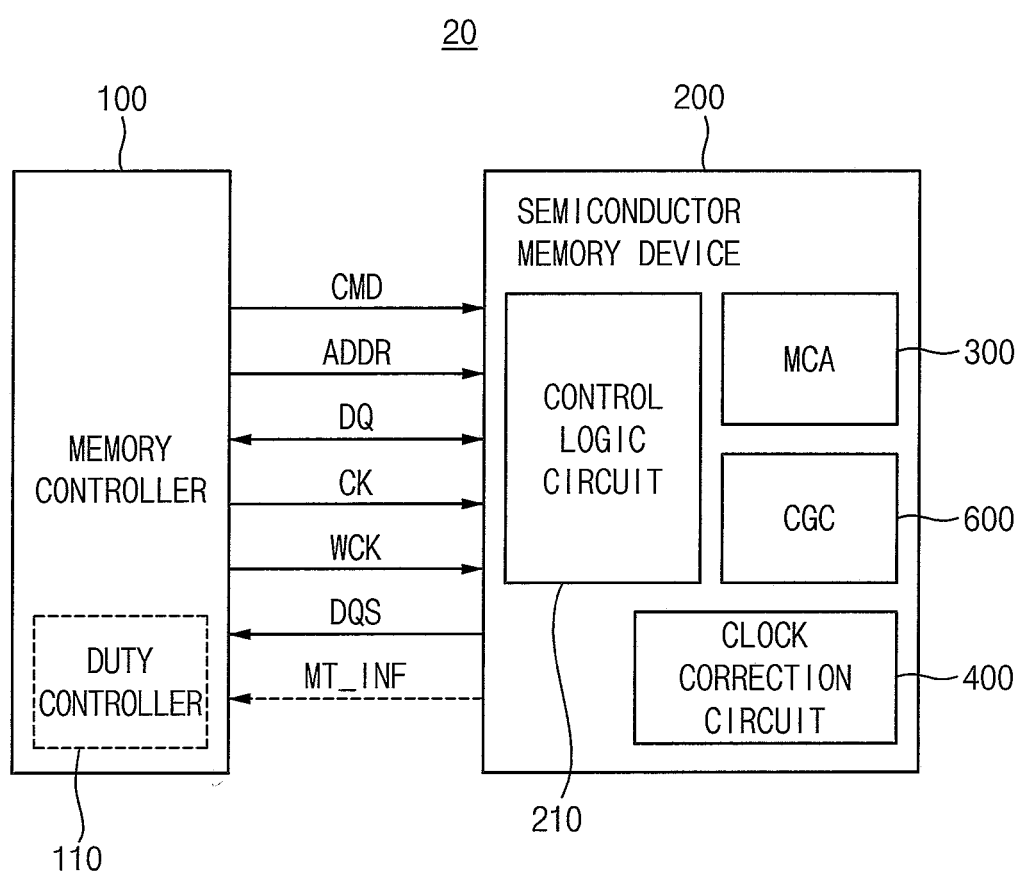
FIG. 1 is a block diagram illustrating a memory system according to example embodiments.

FIG. 1 is a block diagram illustrating a memory system according to example embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to request from the host.

In addition, the memory controller 100 may issue operation commands to the semiconductor memory device 200 for controlling the semiconductor memory device 200.

In some example embodiments, the semiconductor memory device 200 is a memory device including dynamic memory cells such as a dynamic random access memory (DRAM), double data rate 4 (DDR4) synchronous DRAM (SDRAM), a low power DDR4 (LPDDR4) SDRAM, or a LPDDR5 SDRAM.

The memory controller 100 transmits a clock signal CK (the clock signal CK may be referred to a command clock signal), a command CMD, and an address (signal) ADDR to the semiconductor memory device 200. The memory controller 100 may transmit a data clock signal WCK to the semiconductor memory device 200 when the memory controller 100 writes data signal DQ in the semiconductor memory device 200 or reads data signal DQ from the semiconductor memory device 200. The semiconductor memory device 200 may transmit a strobe signal DQS along with the data signal DQ to the memory controller 100 when the semiconductor memory device 200 transmits the data signal DQ to the memory controller 100.

The semiconductor memory device 200 includes a memory cell array 300 that stores the data signal DQ, a control logic circuit 210, a clock correction circuit 400 and a clock generation circuit (CGC) 600.

The control logic circuit 210 may control operations of the semiconductor memory device 200.

The clock correction circuit 400 may generate first through fourth (i.e., first, second, third, and fourth) divided clock signals which have a phase difference of 90 degrees with respect to each other based on the data clock signal WCK, may generate first through fourth adjusted clock signals by adjusting skew of each of the first through fourth divided clock signals, may correct duty errors and skews of the first through fourth adjusted clock signal, and may search associated optimal control code set during a duty training interval of the data clock signal WCK. The terms "first," "second," "third," etc., may be used herein merely to distinguish one element, signal, interval, etc., from another.

The clock generation circuit 600 may generate an output clock signal and the strobe signal DQS based on the first through fourth adjusted clock signals.

Figure 2:
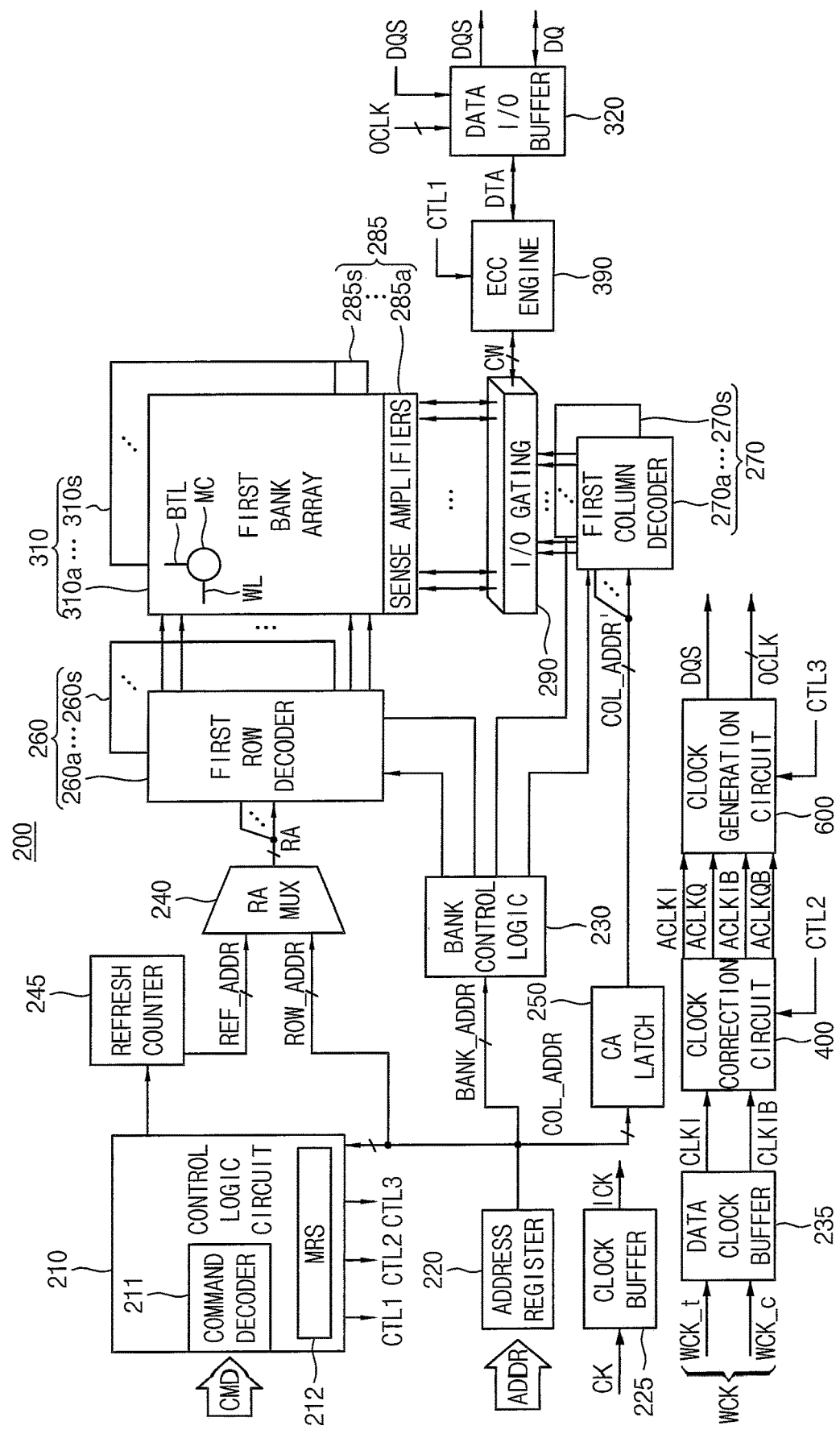
FIG. 2 is a block diagram illustrating the semiconductor memory device in FIG. 1 according to example embodiments.

FIG. 2 is a block diagram illustrating the semiconductor memory device in FIG. 1 according to example embodiments.

Referring to FIG. 2, the semiconductor memory device 200 may include the control logic circuit 210, an address register 220, a bank control logic 230, a refresh counter 245, a row address multiplexer 240, a column address latch 250, a row decoder 260, a column decoder 270, the memory cell array 300, a sense amplifier unit 285, an input/output (I/O) gating circuit 290, an error correction code (ECC) engine 390, a clock buffer 225, a data clock buffer 235, the clock correction circuit 400, the clock generation circuit 600 and a data I/O buffer 320.

The memory cell array 300 includes first through sixteenth bank arrays 310a-310s. The row decoder 260 includes first through sixteenth row decoders 260a-260s respectively coupled to the first through sixteenth bank arrays 310a-310s, the column decoder 270 includes first through sixteenth column decoders 270a-270s respectively coupled to the first through sixteenth bank arrays 310a-310s, and the sense amplifier unit 285 includes first through sixteenth sense amplifiers 285a-285s respectively coupled to the first through sixteenth bank arrays 310a-310s.

The first through sixteenth bank arrays 310a-310s, the first through sixteenth row decoders 260a-260s, the first through sixteenth column decoders 270a-270s and first through sixteenth sense amplifiers 285a-285s may form first through sixteenth banks. Each of the first through sixteenth bank arrays 310a-310s includes a plurality of memory cells MC formed at intersections of a plurality of word-lines WL and a plurality of bit-line BTL.

The address register 220 may receive the address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through sixteenth row decoders 260a-260s corresponding to the bank address BANK_ADDR is activated in response to the bank control signals, and one of the first through sixteenth column decoders 270a-270s corresponding to the bank address BANK_ADDR is activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 is applied to the first through sixteenth row decoders 260a-260s.

The refresh counter 245 may sequentially increase or decrease the refresh row address REF_ADDR under control of the control logic circuit 210.

The activated one of the first through sixteenth row decoders 260a-260s, by the bank control logic 230, may decode the row address RA that is output from the row address multiplexer 240, and may activate a word-line corresponding to the row address RA. For example, the activated bank row decoder applies a word-line driving voltage to the word-line corresponding to the row address.

The column address latch 250 may receive the column address COL_ADDR from the address register 220, and may temporarily store the received column address COL_ADDR. In some embodiments, in a burst mode, the column address latch 250 may generate column address COL_ADDR' that increment from the received column address COL_ADDR. The column address latch 250 may apply the temporarily stored or generated column address COL_ADDR' to the first through sixteenth column decoders 270a-270s.

The activated one of the first through sixteenth column decoders 270a-270s activates a sense amplifier corresponding to the bank address BANK_ADDR and the column address COL_ADDR through the I/O gating circuit 290.

The I/O gating circuit 290 may include a circuitry for gating input/output data, and may further include input data mask logic, read data latches for storing data that is output from the first through sixteenth bank arrays 310a-310s, and write drivers for writing data to the first through sixteenth bank arrays 310a-310s.

Codeword CW read from one bank array of the first through sixteenth bank arrays 310a-310s is sensed by a sense amplifier coupled to the one bank array from which the data is to be read, and is stored in the read data latches. The codeword CW stored in the read data latches may be provided to the data I/O buffer 320 as data DTA after ECC decoding is performed on the codeword CW by the ECC engine 390. The data I/O buffer 320 may convert the data DTA into the data signal DQ based on output clock signals OCLK and may transmit the data signal DQ along with the strobe signal DQS to the memory controller 100.

The data signal DQ to be written in one bank array of the first through sixteenth bank arrays 310a-310s may be provided to the data I/O buffer 320 from the memory controller 100. The data I/O buffer 320 may convert the data signal DQ to the data DTA and may provide the data DTA to the ECC engine 390. The ECC engine 390 may perform an ECC encoding on the data DTA to generate parity bits, and the ECC engine 390 may provide the codeword CW including data DTA and the parity bits to the I/O gating circuit 290. The I/O gating circuit 290 may write the codeword CW in a sub-page in one bank array through the write drivers.

The data I/O buffer 320 may provide the data signal DQ from the memory controller 100 to the ECC engine 390 by converting the data signal DQ to the data DTA in a write operation of the semiconductor memory device 200 and may convert the data DTA to the data signal DQ from the ECC engine 390 based on an output clock signals OCLK from the clock generation circuit 600, and may transmit the data signal DQ and the strobe signal DQS to the memory controller 100 in a read operation of the semiconductor memory device 200. The data I/O buffer 320 may output the data signal DQ to the outside (e.g., to a device external to the memory device 200) based on the output clock signals OCLK in the read operation.

The ECC engine 390 may perform an ECC encoding and an ECC decoding on the data DTA based on a first control signal CTL1 from the control logic circuit 210.

The clock buffer 225 may receive the clock signal CLK, may generate an internal clock signal ICK by buffering the clock signal CLK, and may provide the internal clock signal ICK to circuit components processing the command CMD and the address ADDR.

The data clock buffer 235 may receive the data clock signal WCK including differential clock signal pair WCK_t and WCK_c, may generate a first clock signal CLKI and a second clock signal CLKIB which have a phase difference of 180 degrees with respect to each other, based on the data clock signal WCK and may provide the first clock signal CLKI and the second clock signal CLKIB to the clock correction circuit 400. The first clock signal CLKI may be referred to an in-phase clock signal and the second clock signal CLKIB may be referred to a quadrature-phase clock signal.

In example embodiments, the semiconductor memory device 200 may not include the data clock buffer WCK and the clock correction circuit 400 may receive the data clock signal WCK including differential clock signal pair WCK_t and WCK_c from the memory controller 100.

The clock correction circuit 400 may generate first through fourth divided clock signals which have a phase difference of 90 degrees with respect to each other based on the first clock signal CLKI and the second clock signal CLKIB or based the data clock signal WCK, may generate first through fourth adjusted clock signals ACLKI, ACLKQ, ACLKIB and ACLKQB by adjusting skew of each of the first through fourth divided clock signals, may perform sequentially a first duty cycle training to search a second control code set, a second duty cycle training to search a third control code set and a third duty cycle training to search the first control code set during a duty training interval based on a duty training command received from the memory controller 100, and may provide the first through fourth adjusted clock signals ACLKI, ACLKQ, ACLKIB and ACLKQB to the clock generation circuit 600 after end of the duty training interval. The second control code set may be associated with the first divided clock signal and the third divided clock signal, the third control code set may be associated with the second divided clock signal and the fourth divided clock signal, and the first control code set being associated with the first divided clock signal and the second divided clock signal.

The clock generation circuit 600 may generate the output clock signal OCLK and the strobe signal DQS based on the first through fourth adjusted clock signals ACLKI, ACLKQ, ACLKIB and ACLKQB and may provide the output clock signal OCLK and the strobe signal DQS to the data I/O buffer 320.

The control logic circuit 210 may control operations of the semiconductor memory device 200. For example, the control logic circuit 210 may generate control signals for the semiconductor memory device 200 in order to perform a write operation, a read operation or a duty training operation. The control logic circuit 210 includes a command decoder 211 that decodes the command CMD received from the memory controller 100 and a mode register set (MRS) 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the ECC engine 390, a second control signal CTL2 to control the clock correction circuit 400 and a third control signal CTL3 to control the clock generation circuit 600.

Figure 3:
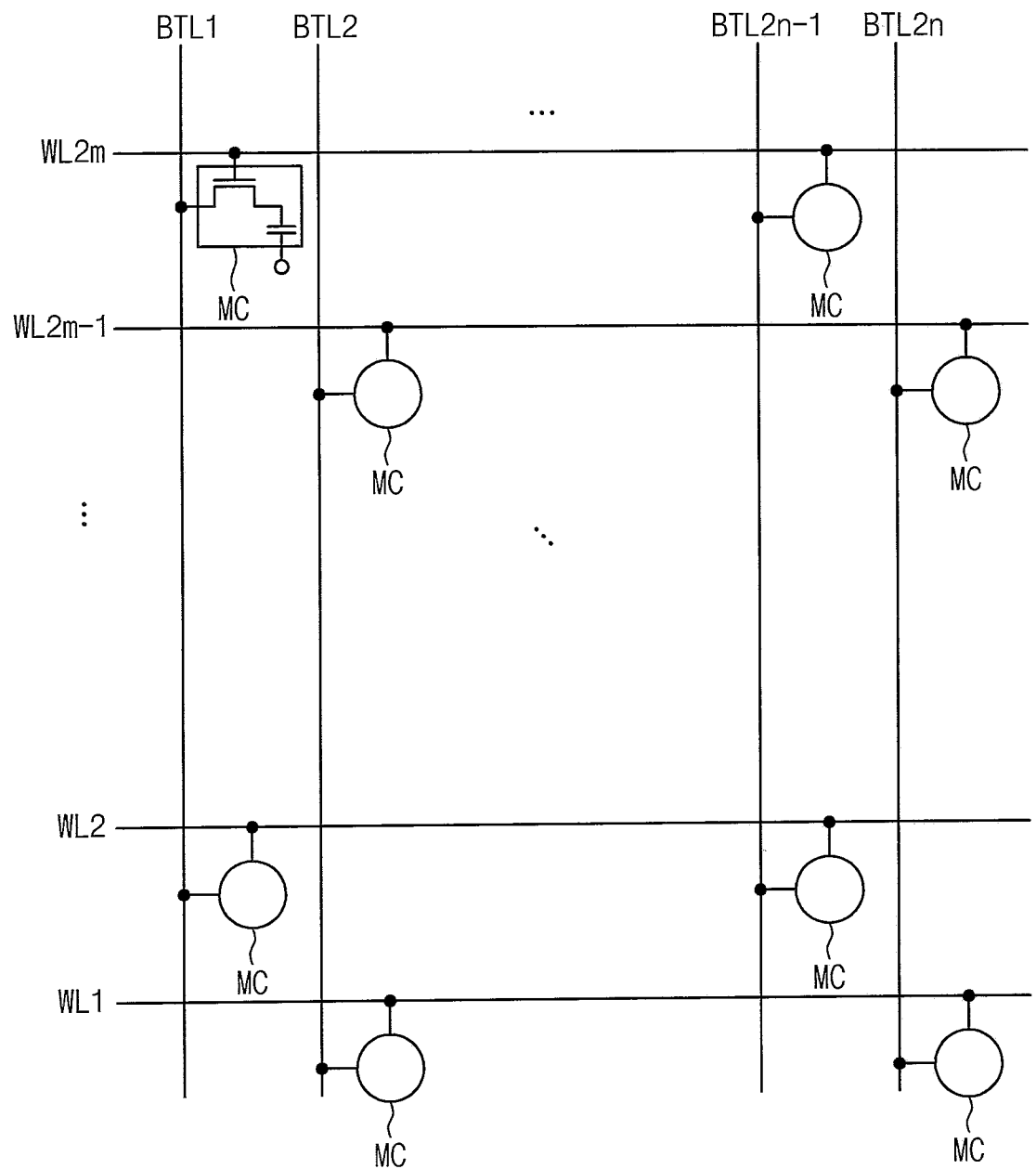
FIG. 3 illustrates an example of the first bank array in the semiconductor memory device of FIG. 2.

FIG. 3 illustrates an example of the first bank array in the semiconductor memory device of FIG. 2.

Referring to FIG. 3, the first bank array 310 includes a plurality of word-lines WL1~WL2m (m is a natural number greater than two), a plurality of bit-lines BTL1~BTL2n (n is a natural number greater than two), and a plurality of memory cells MCs disposed at intersections between the word-lines WL1~WL2m and the bit-lines BTL1~BTL2n. Each of the memory cells MCs includes a cell transistor coupled to each of the word-lines WL1~WL2m and each of the bit-lines BTL1~BTL2n and a cell capacitor coupled to the cell transistor.

The word-lines WL1~WL2m coupled to the a plurality of memory cells MCs may be referred to as rows of the first bank array 310 and the bit-lines BTL1~BTL2n coupled to the a plurality of memory cells MCs may be referred to as columns of the first bank array 310.

Figure 4A:
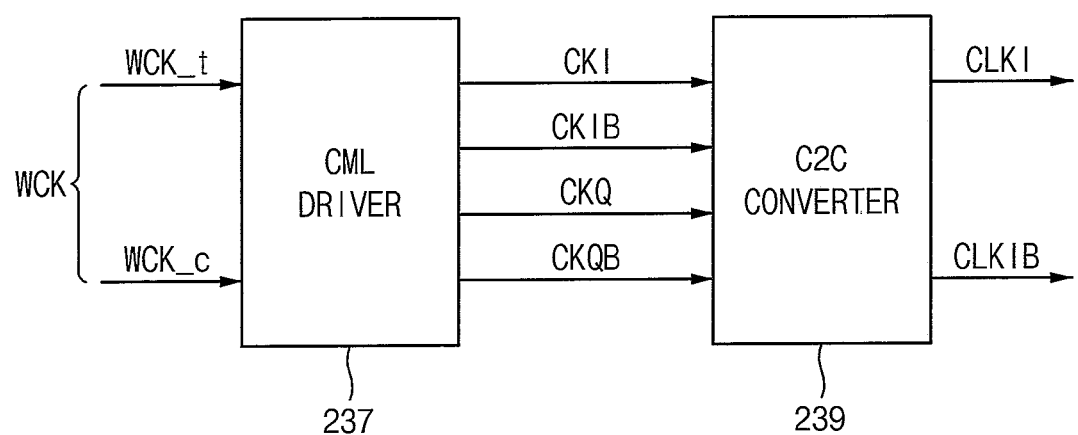
FIG. 4A is a block diagram illustrating an example of the data clock buffer in the semiconductor memory device of FIG. 2 according to example embodiments.

FIG. 4A is a block diagram illustrating an example of the data clock buffer in the semiconductor memory device of FIG. 2 according to example embodiments.

Referring to FIG. 4A, the data clock buffer 235 may include a current mode logic (CML) driver 237 and a CML to complementary metal-oxide semiconductor (CMOS) level (C2C) converter 239.

The CML driver 237 may drive the data clock signal WCK including differential clock signal pair WCK_t and WCK_c and have a CML level to generate internal clock signals CKI, CKQ, CKIB and CKQB which have a phase difference of 90 degrees with respect to one another and the C2C converter 239 may generate the first clock signal CLKI and the second clock signal CLKIB which have a phase difference of 180 degrees with respect to each other, based on the data clock signal WCK and have a CMOS level. The C2C converter 239 may provide the first clock signal CLKI and the second clock signal CLKIB to the clock correction circuit 400 in FIG. 2.

Figure 4B:
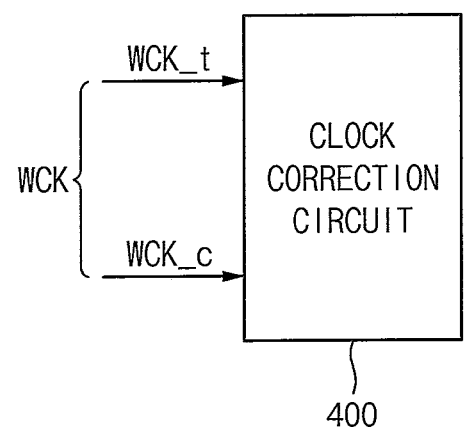
FIG. 4B illustrates that the clock correction circuit directly receives the data clock signal in the semiconductor memory device of FIG. 2 according to example embodiments.

FIG. 4B illustrates that the clock correction circuit directly receives the data clock signal in the semiconductor memory device of FIG. 2 according to example embodiments.

Referring to FIG. 4B, the data clock signal WCK including differential clock signal pair WCK_t and WCK_c may be directly input to the clock correction circuit 400. The differential clock signal WCK_t may be referred to as a first data clock signal, and the differential clock signal WCK_c may be referred to as a second data clock signal.

Figure 5:
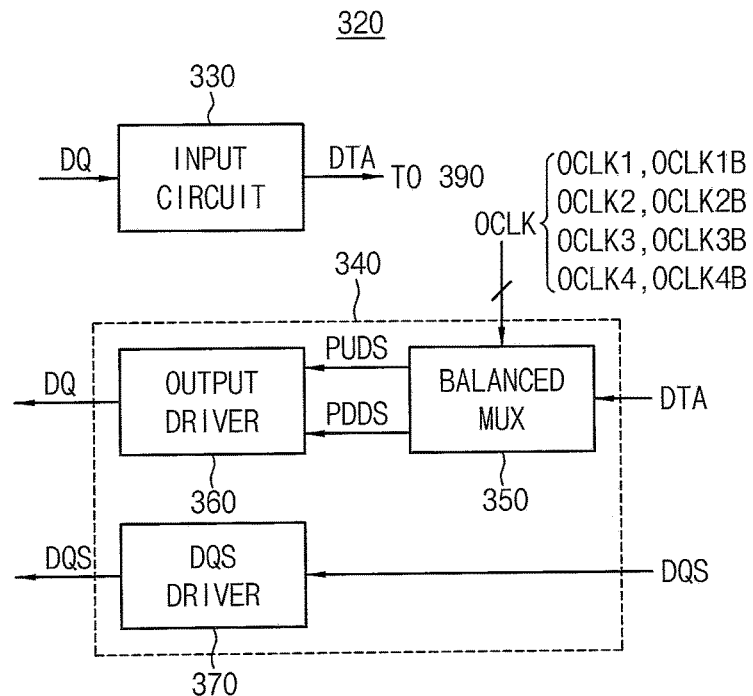
FIG. 5 illustrates an example of the data I/O buffer in the semiconductor memory device of FIG. 2 according to example embodiments.

FIG. 5 illustrates an example of the data I/O buffer in the semiconductor memory device of FIG. 2 according to example embodiments.

Referring to FIG. 5, the data I/O buffer 320 may include a data input circuit 330 and a data output circuit 340. The data output circuit 340 may include a balanced multiplexer 350, an output driver 360 and a strobe (DQS) driver 370.

The data input circuit 330 may receive the data signal DQ from the memory controller 100, may convert the data signal DQ to the data DTA, and may provide the data DTA to the ECC engine 390. The data output circuit 340 may convert data DTA from the ECC engine 390 to the data signal DQ and provide the data signal DQ to the memory controller 100.

The balanced multiplexer 350 may receive the data DTA and the output clock signal OCLK, may generate a pull-up driving signal PUDS and a pull-down driving signal PDDS based on the data DTA and the output clock signal OCLK, and may provide the pull-up driving signal PUDS and the pull-down driving signal PDDS to the output driver 360. The balanced multiplexer 350 may generate the pull-up driving signal PUDS and the pull-down driving signal PDDS by sampling the data DTA based on the output clock signal OCLK. The output clock signal OCLK may include first through fourth output clock signals pairs OCLK1 and OCLKB1, OCLK2 and OCLKB2, OCLK3 and OCLKB3 and OCLK4 and OCLKB4. Each of the first through fourth output clock signals pairs OCLK1 and OCLKB1, OCLK2 and OCLKB2, OCLK3 and OCLKB3 and OCLK4 and OCLKB4 may have a phase difference of 180 degrees with respect to each other.

For example, when the data DTA is at a high level, the balanced multiplexer 350 generate the pull-up driving signal PUDS and the pull-down driving signal PDDS for turning off all transistors included in a pull-down driver (such as a pull-down driver 363 shown in FIG. 6) of the output driver 360. Contrarily, when the data DTA is at a low level, the balanced multiplexer 350 may generate the pull-down driving signal PDDS and the pull-up driving signal PUDS for turning off all transistors included in a pull-up driver (such as a pull-up driver 361 shown in FIG. 6) of the output driver 360.

Figure 6:
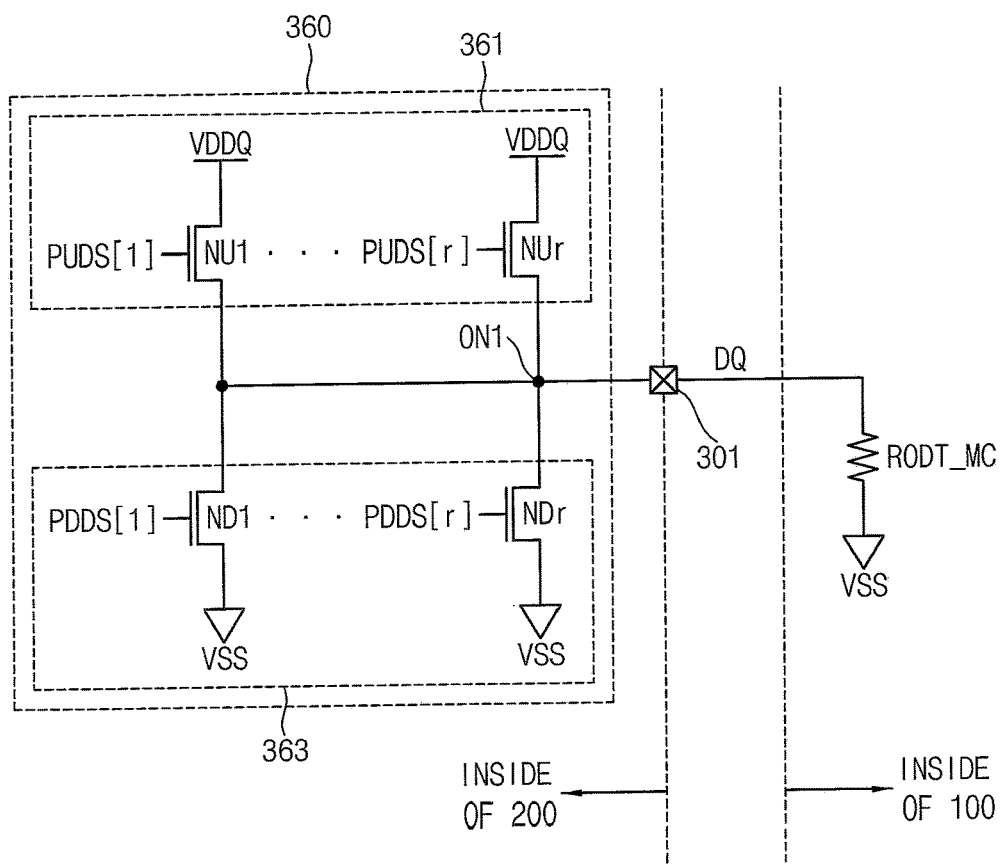
FIG. 6 illustrates a circuit diagram of an output driver in the data I/O buffer in FIG. 5 according to example embodiments.

FIG. 6 illustrates a circuit diagram of an output driver in the data I/O buffer in FIG. 5 according to example embodiments.

Referring to FIG. 6, the output driver 360 may include the pull-up driver 361 and the pull-down driver 363.

The pull-up driver 361 may include first through r-th (r is a natural number greater than one) pull-up transistors NU1 through NUr connected between the power supply voltage VDDQ and an output node ON1. Each of the first through r-th pull-up transistors NU1 through NUr may be an n-channel metal oxide semiconductor (NMOS) transistor. The pull-down driver 363 may include first through r-th pull-down transistors ND1 through NDr connected between the output node ON1 and a ground voltage VSS. Each of the first through r-th pull-down transistors ND1 through NDr may be an NMOS transistor.

When the data DTA is at the high level, the pull-up driver 361 may receive the pull-up driving signal PUDS (e.g., PUDS[1] through PUDS[r]) corresponding to the pull-up control code PUCD from the pre-driver 350 and generate the current determined by the pull-up control code PUCD. The pull-down transistors ND1 through NDr included in the pull-down driver 363 may all be turned off according to the pull-down driving signal PDDS (e.g., PDDS[1] through PDDS[r]).

At this time, when the data DTA is at the high level, the current generated by the pull-up driver 361 may be transmitted to an on-die termination (ODT) resistor RODT_MC in the memory controller 100 via the data I/O (or DQ) pad 301. The data signal DQ that the ODT resistor RODT_MC receives is determined by the current generated by the pull-up driver 361 and the ODT resistor RODT_MC.

When the data DTA is at the low level, the pull-up transistors NU1 through NUr included in the pull-up driver 361 may all be turned off according to the pull-up driving signal PUDS. The pull-down driver 363 may receive the pull-down driving signal PDDS corresponding to the pull-down control code PDCD from the pre-driver 330 and may have a resistance determined by the pull-down control code PDCD.

At this time, when the data DTA is at the low level, no current is generated by the pull-up driver 361, and therefore, the data signal DQ that the ODT resistor RODT_MC receives has an output low level voltage (VOL) voltage which is substantially the same as the ground voltage VSS.

According to example embodiments, the total resistance, e.g., a termination resistance (RTT), of the pull-up driver 361 or the pull-down driver 363 may be changed in response to a particular pull-up or pull-down driving signal PUDS or PDDS.

Figure 7:
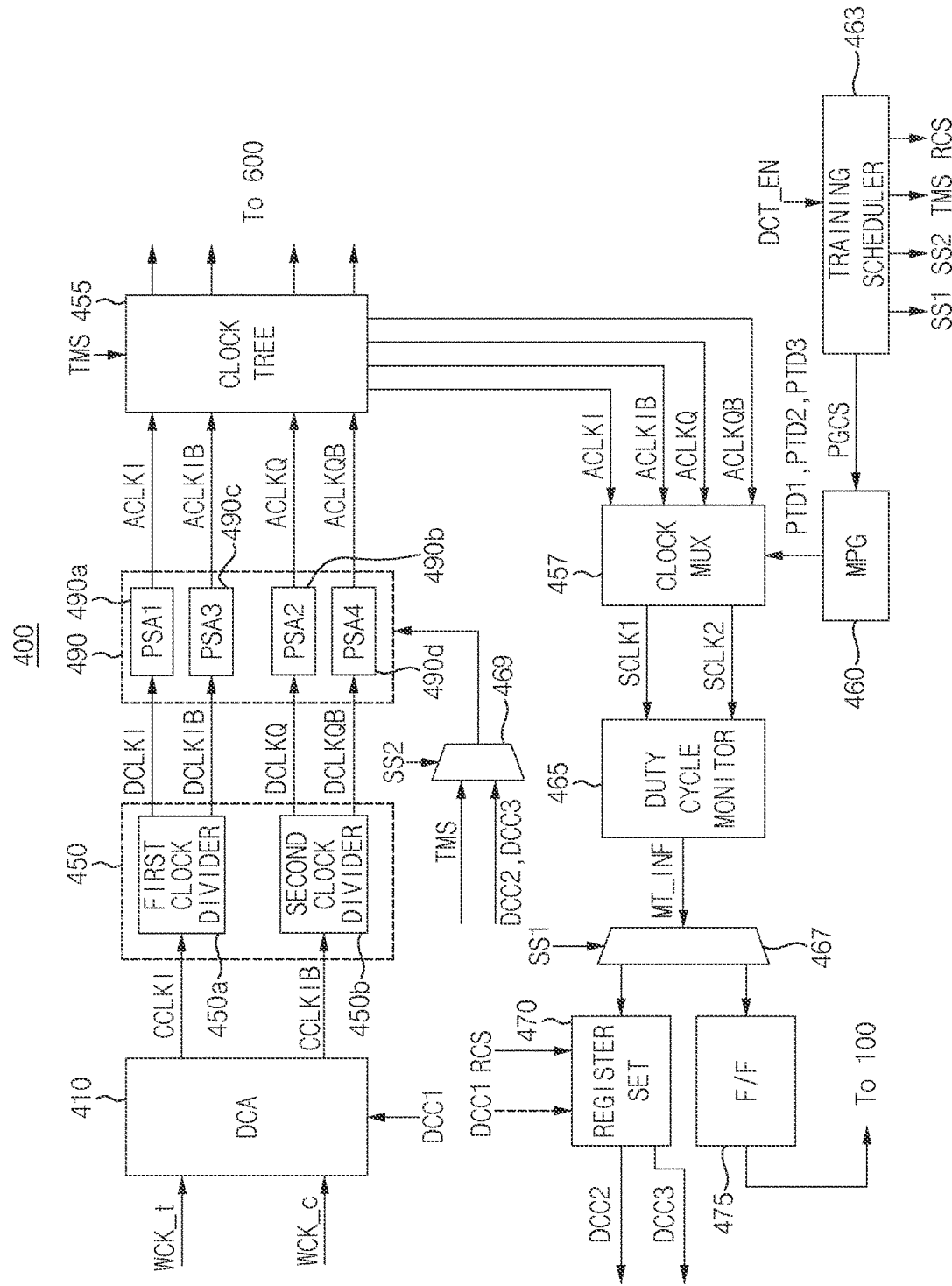
FIG. 7 is a block diagram illustrating an example of the clock correction circuit in the semiconductor memory device of FIG. 2 according to example embodiments.

FIG. 7 is a block diagram illustrating an example of the clock correction circuit in the semiconductor memory device of FIG. 2 according to example embodiments.

Referring to FIG. 7, the clock correction circuit 400 may include a duty cycle adjuster (circuit) 410, a clock division circuit 450, a phase skew adjusting circuit 490, a clock tree 455, a clock multiplexer (MUX) 457, a multi pattern generator (MPG) 460, a training scheduler 463, a duty cycle monitor 465, a demultiplexer 467, a multiplexer 469, a register set 470 and a flip-flop 475.

The duty cycle adjuster 410 may generate a first corrected clock signal CCLKI and a second corrected clock signal CCLKIB which have a phase difference of 180 degrees with respect to each other by correcting a duty error of the data clock signal WCK including the pair of differential clock signals WCK_t and WCK_c based on a first control code set DCC1. The first control code set DCC1 along with the duty training command may be provided from the memory controller 100 and may be stored in the mode register set 212 in FIG. 2.

The clock division circuit 450 may include a first clock divider 450a and a second clock divider 450b. The first clock divider 450a may divide the first corrected clock signal CCLKI to generate the first divided clock signal DCLKI and the third divided clock signal DCLKIB having a phase difference of 180 degrees with respect to each other. The second clock divider 450b may divide the second corrected clock signal CCLKIB to generate the second divided clock signal DCLKQ and the fourth divided clock signal DCLKQB having a phase difference of 180 degrees with respect to each other.

The phase skew adjusting circuit 490 may generate the first through fourth adjusted clock signals ACLKI, ACLKQ, ACLKIB and ACLKQB by adjusting phase skews of the first through fourth divided clock signals DCLKI, DCLKQ, DCLKIB and DCLKQB during the duty training interval. The phase skew adjusting circuit 490 may include first through fourth phase skew adjusters 490a, 490b, 490c and 490d and each of the first through fourth phase skew adjusters 490a, 490b, 490c and 490d may generate each of the first through fourth adjusted clock signals ACLKI, ACLKQ, ACLKIB and ACLKQB by adjusting a phase skew of respective one of the first through fourth divided clock signals DCLKI, DCLKQ, DCLKIB and DCLKQB.

Each of the first and third phase skew adjusters 490a and 490c may adjust the phase skew of respective one of the first and third division clock signals DCLKI and DCLKIB based on default values of the second control code in a second interval responding to a training mode signal TMS, and each of the second and fourth phase skew adjusters 490b and 490d may adjust the phase skew of respective one of the second and fourth division clock signals DCLKQ and DCLKQB based on default values of the third control code in a third interval responding to the training mode signal TMS.

The clock tree 455 may provide the clock multiplexer 457 with the first through fourth adjusted clock signals ACLKI, ACLKQ, ACLKIB and ACLKQB during the duty training interval and may provide the clock generation circuit 600 with the first through fourth adjusted clock signals ACLKI, ACLKQ, ACLKIB and ACLKQB after an end of the duty training interval.

The training scheduler 463 may divide the duty training interval into a first interval, a second interval and a third interval which are consecutive and may generate training control signals PGCS, SS1, SS2, TMS and RCS during which a duty training signal DCT_EN which is based on the duty training command is activated.

The multi pattern generator 460 may generate a first pattern data PTD1 during the first interval, may generate a second pattern data PTD2 during the second interval and may generate a third pattern data PTD3 during the third interval based on a pattern generation control signal PGCS in the training control signals PGCS, SS1, SS2, TMS and RCS.

The clock multiplexer 457 may provide the first adjusted clock signal ACLKI and the third adjusted clock signal ACLKIB as a first selected clock signal SCLK1 and a second selected clock signal SCLK2 from among the first through fourth adjusted clock signals ACLKI, ACLKQ, ACLKIB and ACLKQB based on the first pattern data PTD1 during the first interval, may provide the second adjusted clock signal ACLKQ and the fourth adjusted clock signal ACLKQB as the first selected clock signal SCLK1 and the second selected clock signal SCLK2 from among the first through fourth adjusted clock signals ACLKI, ACLKQ, ACLKIB and ACLKQB based on the second pattern data PTD2 during the second interval, and may provide the first adjusted clock signal ACLKI and the second adjusted clock signal ACLKQ as the first selected clock signal SCLK1 and the second selected clock signal SCLK2 from among the first through fourth adjusted clock signals ACLKI, ACLKQ, ACLKIB and ACLKQB based on the third pattern PTD3 data during the third interval.

The duty cycle monitor 465 may monitor duty cycles of the first selected clock signal SCLK1 and the second selected clock signal SCLK2 in each of the first interval, the second interval and the third interval and may generate monitoring information MT_INF based on a result of the monitoring.

The duty cycle monitor 465 may include first delay cells, a second delay cells, a plurality of comparators and a duty determiner. The first delay cells may sequentially delay the first selected clock signal SCLK1. The second delay cells may sequentially delay the first selected clock signal SCLK2. The plurality of comparators may compare outputs of the first delay cells and the second delay cells. The duty determiner may generate the monitoring information MT_INF based on outputs of the plurality of comparators. The outputs of the plurality of comparators may vary based on a duty ratio of the first selected clock signal SCLK1 and a duty ratio of the second selected clock signal SCLK2. Values of the monitoring information MT_INF including N-bits may vary based on the outputs of the plurality of comparators.

The demultiplexer 467 may provide the monitoring information MT_INF to the register set 470 in the first interval and may provide the monitoring information MT_INF to the memory controller 100 through the flip-flop 475 in the second interval, based on a first selection signal SS1 in the training control signals PGCS, SS1, SS2, TMS and RCS.

The multiplexer 469 may provide the training mode signal TMS to the phase skew adjusting circuit 490 during the duty training interval and may provide the phase skew adjusting circuit 490 with a second control code set DCC2 and a third control code set DCC3 stored in the register set 470 after the end of the duty training interval, based on a second selection signal SS2 in the training control signals PGCS, SS1, SS2, TMS and RCS.

The register set 470 may store the second control code set DCC2 and the third control code set DCC3 which are searched based on the monitoring information MT_INF during the duty training interval, and may provide the phase skew adjusting circuit 490 with the second control code set DCC2 and the third control code set DCC3 after the end of the duty training interval, based on a register control signal RCS in the training control signals PGCS, SS1, SS2, TMS and RCS.

In example embodiments, the first control code set DCC1 which is updated and the register set 470 may provide the phase skew adjusting circuit 490 with the first control code set DCC1 after the end of the duty training interval.

Figure 8:
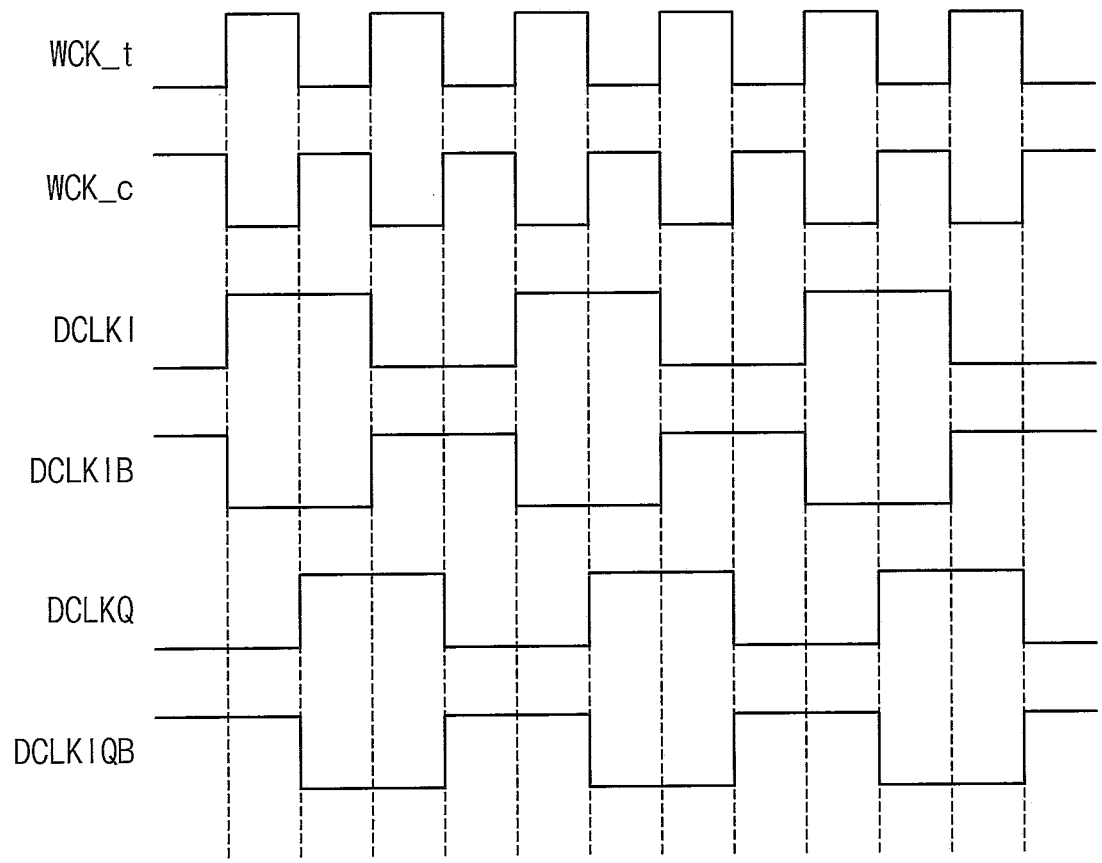
FIG. 8 illustrates the data clock signals and the first through fourth divided clock signals in the clock correction circuit of FIG. 7 according to example embodiments.

FIG. 8 illustrates the data clock signals and the first through fourth divided clock signals in the clock correction circuit of FIG. 7 according to example embodiments.

Referring to FIGS. 7 and 8, the first clock divider 450a may divide the first corrected clock signal CCLKI associated with the first data clock signal WCK_t to generate the first divided clock signal DCLKI and the third divided clock signal DCLKIB having a phase difference of 180 degrees with respect to each other. The second clock divider 450b may divide the second corrected clock signal CCLKIB associated with the second data clock signal WCK_c to generate the second divided clock signal DCLKQ and the fourth divided clock signal DCLKQB having a phase difference of 180 degrees with respect to each other. Therefore, the duty cycle adjuster 410 may adjust phase skews of the first divided clock signal DCLKI and the second divided clock signal DCLKQ by adjusting duty errors of the first data clock signal WCK_t and the second data clock signal WCK_c.

Figure 9:
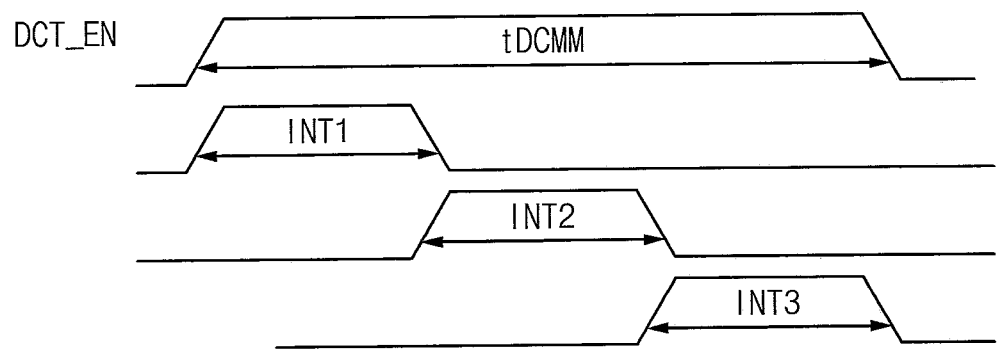
FIG. 9 illustrates an example operation of the training scheduler in the clock correction circuit of FIG. 7 according to example embodiments.

FIG. 9 illustrates an example operation of the training scheduler in the clock correction circuit of FIG. 7 according to example embodiments.

Referring to FIGS. 7 and 9, the training scheduler 463 may divide the duty training interval tDCMM into a first interval INT1, a second interval INT2 and a third interval INT3 which are consecutive during which the duty training signal DCT_EN is activated. Each of the first interval INT1, the second interval INT2 and the third interval INT3 may have a substantially same time interval.

Figure 10:
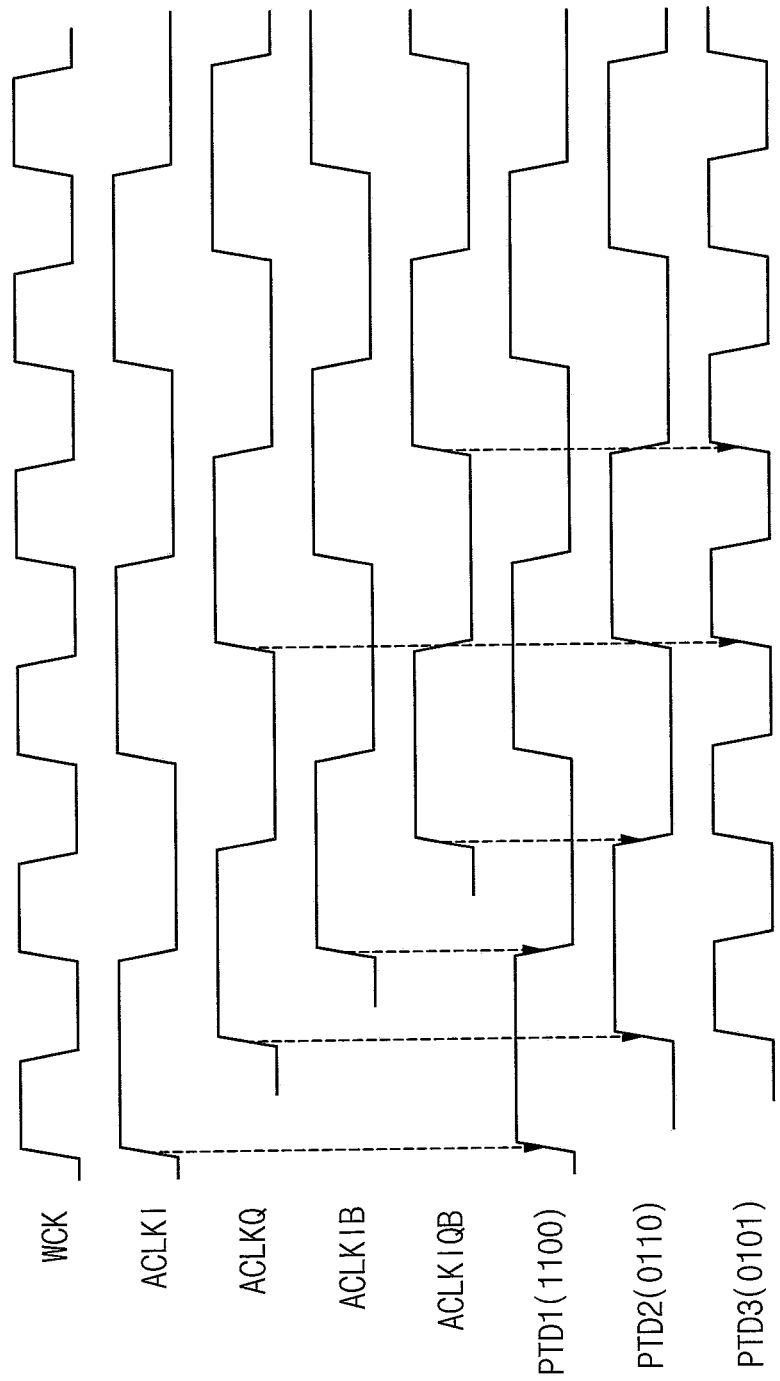
FIG. 10 illustrates example operations of the multi pattern generator and the clock multiplexer in the clock correction circuit of FIG. 7 according to example embodiments.

FIG. 10 illustrates example operations of the multi pattern generator and the clock multiplexer in the clock correction circuit of FIG. 7 according to example embodiments.

Referring to FIG. 10, a frequency of each of the first through fourth adjusted clock signals ACLKI, ACLKQ, ACLKIB and ACLKQB may correspond to a half of a frequency of the data clock signal WCK.

The clock multiplexer 457 may select the first adjusted clock signal ACLKI and the third adjusted clock signal ACLKIB from among the first through fourth adjusted clock signals ACLKI, ACLKQ, ACLKIB and ACLKQB in response to each of a rising edge and a falling edge of the first pattern data PTD1 having logic levels corresponding to '1100' from the multi pattern generator 460 during the first interval, may select the second adjusted clock signal ACLKQ and the fourth adjusted clock signal ACLKQB from among the first through fourth adjusted clock signals ACLKI, ACLKQ, ACLKIB and ACLKQB in response to each of a rising edge and a falling edge of the second pattern data PTD2 having logic levels corresponding to '0110' from the multi pattern generator 460 during the second interval, and may select the first adjusted clock signal ACLKI and the second adjusted clock signal ACLKQ from among the first through fourth adjusted clock signals ACLKI, ACLKQ, ACLKIB and ACLKQB in response to each of a rising edge and a falling edge of the third pattern data PTD3 having logic levels corresponding to '0101' from the multi pattern generator 460 during the second interval.

Each of the first pattern data PTD1, the second pattern data PTD2 and the third pattern data PTD3 may have logic levels which are repeated with two periods of the data clock signal WCK.

Figure 11:
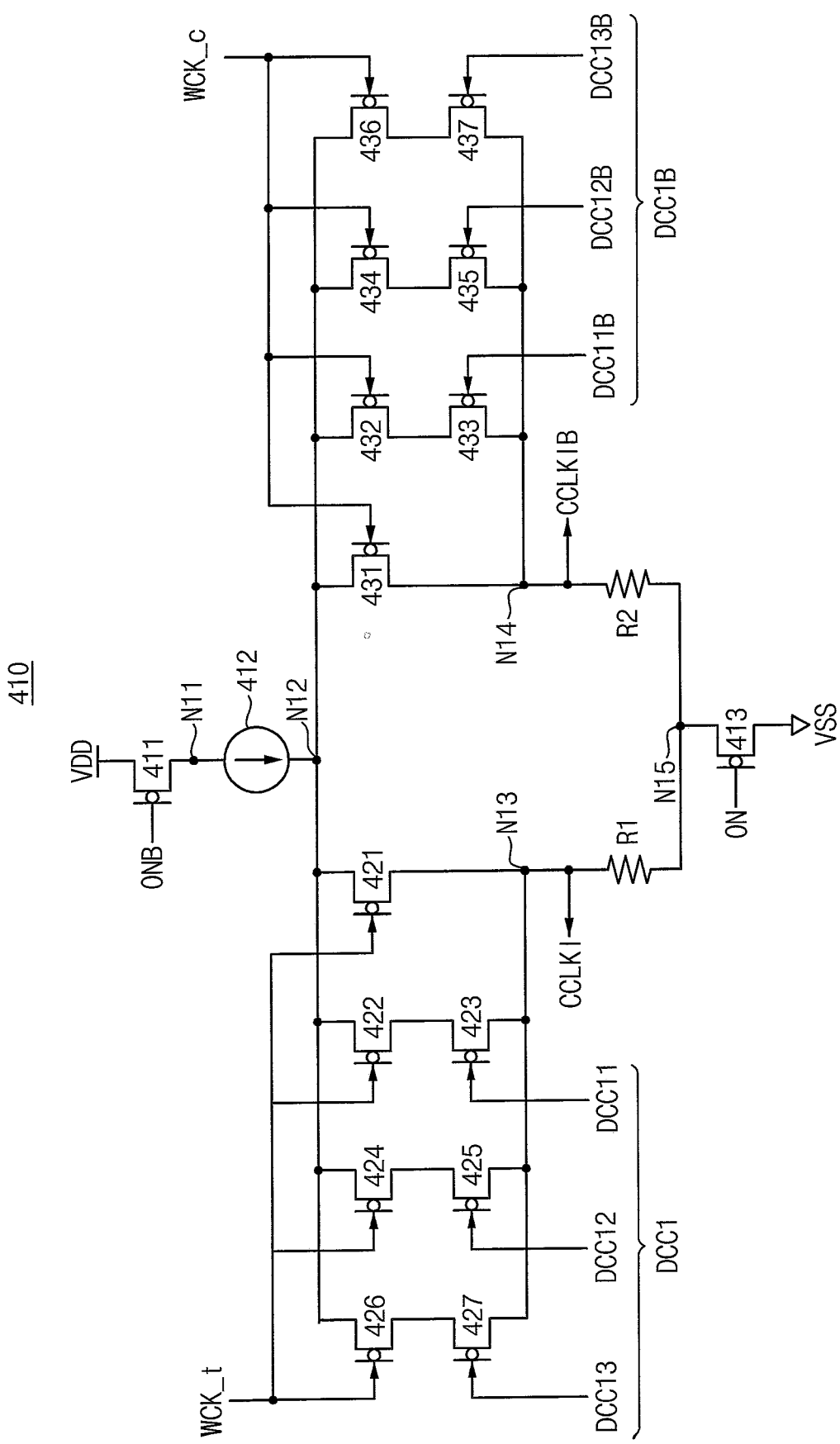
FIG. 11 is a circuit diagram illustrating an example of the duty cycle adjuster in the clock correction circuit of FIG. 7 according to example embodiments.

FIG. 11 is a circuit diagram illustrating an example of the duty cycle adjuster in the clock correction circuit of FIG. 7 according to example embodiments.

Referring to FIG. 11, the duty cycle adjuster 410, a first p-channel metal-oxide semiconductor (PMOS) transistor 411, a current source 412, a second PMOS transistor 421, a plurality of third PMOS transistors 422, 424 and 426, a plurality of fourth PMOS transistors 423, 425 and 427, a fifth PMOS transistor 431, a plurality of sixth PMOS transistors 432, 434 and 436, a plurality of seventh PMOS transistors 433, 437 and 437, a first resistor R1, a second resistor R2 and a n-channel metal-oxide semiconductor (NMOS) transistor 413.

The first PMOS transistor 411 is connected between a power supply voltage VDD and a first node N11 and has a gate to receive a first enable signal ONB. The current source 412 is connected between the first node N11 and a second node N12.

The second PMOS transistor 421 is connected between the second node N12 and a third node N13 and has a gate to receive the first data clock signal WCK_t. Each of the third PMOS transistors 422, 424 and 426 is connected to the second node N12 in parallel with the second PMOS transistor 421, and has a gate to receive the first data clock signal WCK_t. Each of the fourth PMOS transistors 423, 425 and 427 is connected between respective one of the third PMOS transistors 422, 424 and 426 and the third node N13 and has a gate to receive respective bit of bits DCC11, DCC12 and DCC13 of the first control code set DCC1.

The fifth PMOS transistor 431 is connected between the second node N12 and a fourth node N14 and has a gate to receive the second data clock signal WCK_c. Each of the sixth PMOS transistors 432, 434 and 436 is connected to the second node N12 in parallel with the fifth PMOS transistor 431, and has a gate to receive the second data clock signal WCK_c. Each of the seventh PMOS transistors 433, 437 and 437 is connected between respective one of the plurality of sixth PMOS transistors 432, 434 and 436 and the fourth node N14 and has a gate to receive respective bit of bits DCC1B, DCC12B and DCC13B of a first inverted control code set DCC1B obtained by inverting the first control code set DCC1.

The first resistor R1 is connected between the third node N13 and a fifth node N15. The second resistor R2 is connected between the fourth node N14 and the fifth node N15. The NMOS transistor 413 is connected between the fifth node N15 and a ground voltage VSS and has a gate to receive a second enable signal ON complementary with the first enable signal ONB. The duty cycle adjuster 410 may provide the first corrected clock signal CCLKI at the third node N13 and may provide the second corrected clock signal CCLKIB at the fourth node N14.

The duty cycle adjuster 410 may perform duty cycle adjusting operating in response to activation of the first enable signal ONB and the second enable signal ON, each of the fourth PMOS transistors 423, 425 and 427 is selectively turned-on in response to the respective bit of the bits DCC11, DCC12 and DCC13 of the first control code set DCC1, each of the seventh PMOS transistors 433, 435 and 437 is selectively turned-on in response to the respective bit of the bits DCC11B, DCC12B and DCC13B of the first inverted control code set DCC1B, and thus duties of the first data clock signal WCK_t and the second data clock signal WCK_c may be adjusted based on a number of transistors which a current from the current source 412 flows through being adjusted according to the bits DCC11, DCC12 and DCC13 of the first control code set DCC1 and the bits DCC11B, DCC12B and DCC13B of the first inverted control code set DCC1B.

Figure 12:
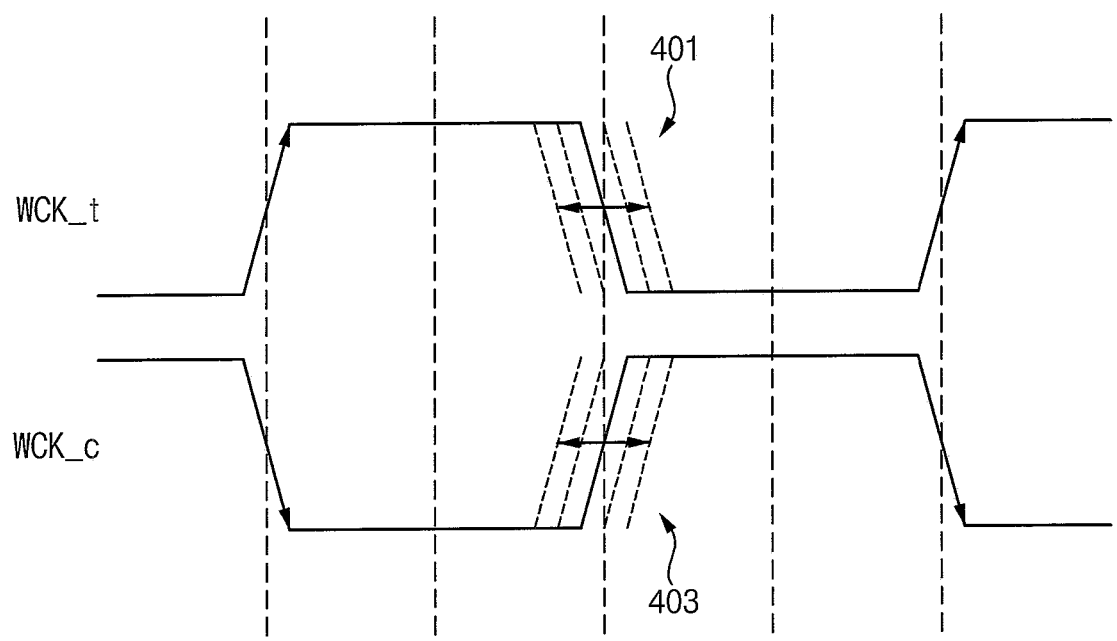
FIG. 12 illustrates an example operation of the duty cycle adjuster of FIG. 11 according to example embodiments.

FIG. 12 illustrates an example operation of the duty cycle adjuster of FIG. 11 according to example embodiments.

Referring to FIGS. 11 and 12, the duty cycle adjuster 410 may adjust the duties of the first data clock signal WCK_t and the second data clock signal WCK_c by adjusting a delay of the falling edge of the first data clock signal WCK_t as a reference numeral 401 indicates and by adjusting the delay of the falling edge of the second data clock signal WCK_c as a reference numeral 403 indicates.

Figure 13:
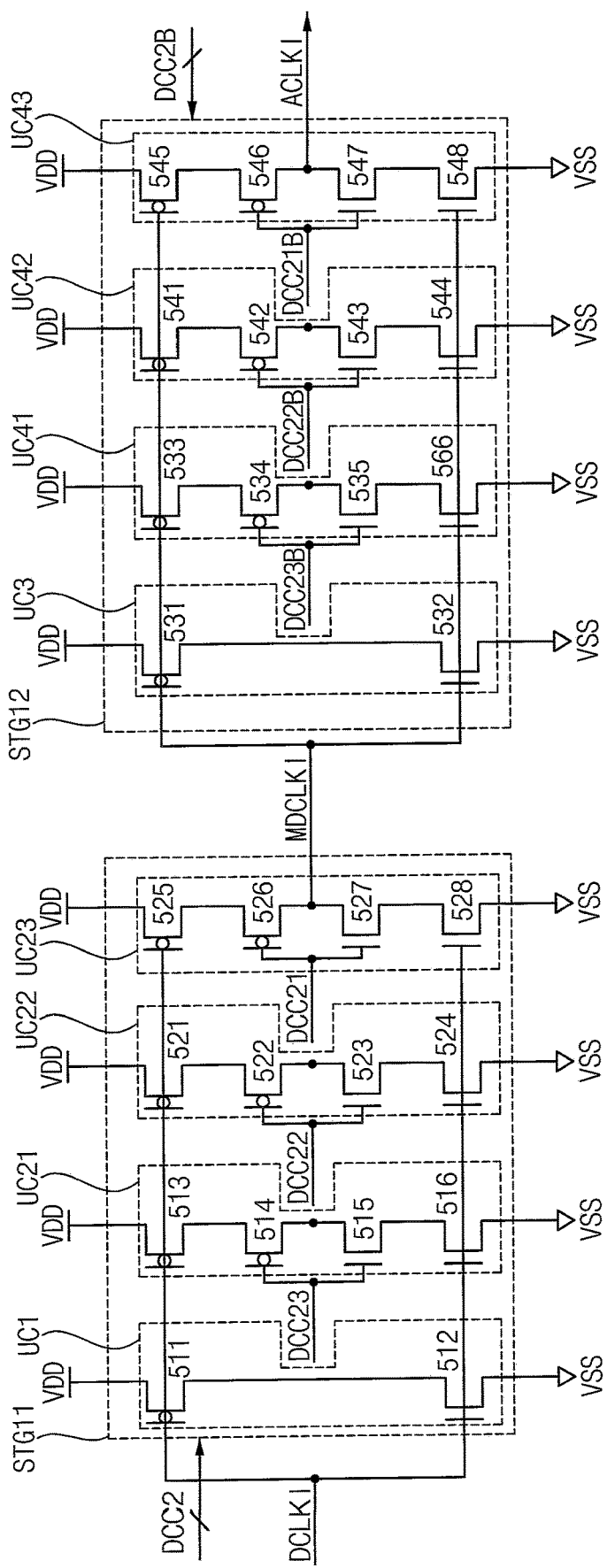
FIG. 13 is a circuit diagram illustrating an example of the first phase skew adjuster in the clock correction circuit of FIG. 7 according to example embodiments.

FIG. 13 is a circuit diagram illustrating an example of the first phase skew adjuster in the clock correction circuit of FIG. 7 according to example embodiments.

Although FIG. 13 illustrates the first phase skew adjuster 490a, each of the second through fourth phase skew adjusters 490b, 490c, and 490d may have substantially the same configuration as the first phase skew adjuster 490a.

Referring to FIG. 13, the first phase skew adjuster 490a may include a first stage STG11 and a second stage STG12.

The first stage STG11 may provide an intermediate clock signal MDCLKI by adjusting slew rate of the rising edge of the first divided clock signal DCLKI based on the second control code set DCC2. The second stage STG12 may provide the first adjusted clock signal ACLKI by adjusting a slew rate of the falling edge of the intermediate clock signal MDCLKI based on second inverted control code set DCC2B obtained by inverting the second control code set DCC2.

The first stage STG11 may include a first unit cell UC1 connected between the power supply voltage VDD and the ground voltage VSS and a plurality of second unit cells UC21, UC22 and UC23 connected between the power supply voltage VDD and the ground voltage VSS in parallel with the first unit cell UC1.

The first unit cell UC1 may include a first PMOS transistor 511 and a first NMOS transistor 512 which are connected in series between the power supply voltage VDD and the ground voltage VSS and each gate of the first PMOS transistor 511 and the first NMOS transistor 512 receives the first divided clock signal DCLKI.

The second unit cell UC21 may include PMOS transistors 513 and 514, and NMOS transistors 515 and 516 which are connected in series between the power supply voltage VDD and the ground voltage VSS. Each gate of the PMOS transistor 513 and the NMOS transistor 516 receives the first divided clock signal DCLKI and each gate of the PMOS transistor 514 and the NMOS transistor 515 receives a corresponding bit DCC23 of the second control code set DCC2.

The second unit cell UC22 may include PMOS transistors 521 and 522 and NMOS transistors 523 and 524 which are connected in series between the power supply voltage VDD and the ground voltage VSS. Each gate of the PMOS transistor 521 and the NMOS transistor 524 receives the first divided clock signal DCLKI and each gate of the PMOS transistor 522 and the NMOS transistor 523 receives a corresponding bit DCC22 of the second control code set DCC2.

The second unit cell UC23 may include PMOS transistors 525 and 526, and NMOS transistors 527 and 528 which are connected in series between the power supply voltage VDD and the ground voltage VSS. Each gate of the PMOS transistor 525 and the NMOS transistor 528 receives the first divided clock signal DCLKI and each gate of the PMOS transistor 526 and the NMOS transistor 527 receives a corresponding bit DCC21 of the second control code set DCC2.

The second stage STG12 may include a third unit cell UC3 connected between the power supply voltage VDD and the ground voltage VSS and a plurality of fourth unit cells UC41, UC42 and UC43 connected between the power supply voltage VDD and the ground voltage VSS in parallel with the third unit cell UC3.

The third unit cell UC3 may include a first PMOS transistor 531 and a first NMOS transistor 532 which are connected in series between the power supply voltage VDD and the ground voltage VSS and each gate of the first PMOS transistor 531 and the first NMOS transistor 532 receives the intermediate clock signal MDCLKI.

The fourth unit cell UC41 may include PMOS transistors 533 and 534, and NMOS transistors 535 and 536 which are connected in series between the power supply voltage VDD and the ground voltage VSS. Each gate of the PMOS transistor 533 and the NMOS transistor 536 receives the intermediate clock signal MDCLKI and each gate of the PMOS transistor 534 and the NMOS transistor 535 receives a corresponding bit DCC23B of the second inverted control code set DCC2B.

The fourth unit cell UC42 may include PMOS transistors 541 and 542 and NMOS transistors 543 and 544 which are connected in series between the power supply voltage VDD and the ground voltage VSS. Each gate of the PMOS transistor 541 and the NMOS transistor 544 receives the intermediate clock signal MDCLKI and each gate of the PMOS transistor 542 and the NMOS transistor 543 receives a corresponding bit DCC22B of the second inverted control code set DCC2B.

The fourth unit cell UC43 may include PMOS transistors 545 and 546, and NMOS transistors 547 and 548 which are connected in series between the power supply voltage VDD and the ground voltage VSS. Each gate of the PMOS transistor 545 and the NMOS transistor 548 receives the intermediate clock signal MDCLKI and each gate of the PMOS transistor 546 and the NMOS transistor 547 receives a corresponding bit DCC21B of the second inverted control code set DCC2B.

Figure 14:
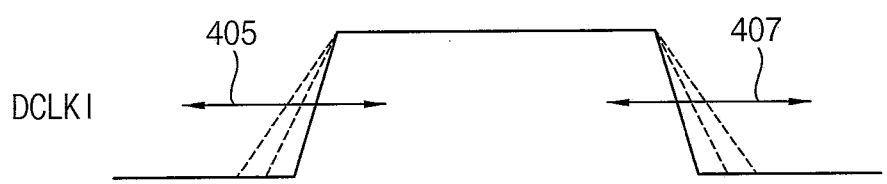
FIGS. 14 and 15 illustrate an operation of the first phase skew adjuster of FIG. 13 according to example embodiments.
Figure 15:
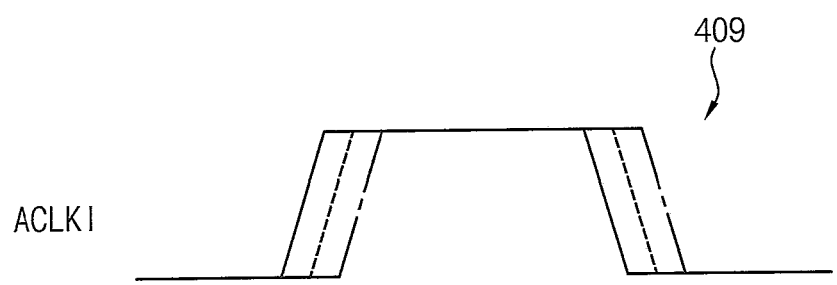

FIGS. 14 and 15 illustrate an operation of the first phase skew adjuster of FIG. 13 according to example embodiments.

Referring to FIGS. 14 and 15, the first phase skew adjuster 490a may adjust a delay amount of the first adjusted clock signal ACLKI as a reference numeral 409 indicates by adjusting a slew rate of a rising edge of the first divided clock signal DCLKI as a reference numeral 405 and by adjusting a slew rate of a falling edge of the first divided clock signal DCLKI as a reference numeral 407, in response to the second control code set DCC2.

Figure 16:
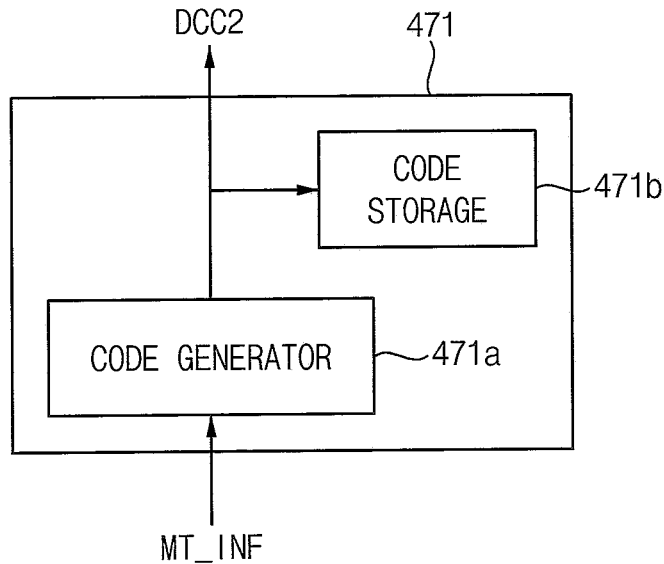
FIG. 16 is a block diagram illustrating a first register circuit in the register set in FIG. 7 according to example embodiments.

FIG. 16 is a block diagram illustrating a first register circuit in the register set in FIG. 7 according to example embodiments.

Referring to FIG. 16, a first register circuit 471 may include a code generator 471a and a code storage 471b. The code generator 471a may start an operation of generating the second control code set DCC2 based on the monitoring information MT_INF. The code generator 471a may store the second control code set DCC2 in the code storage 471b.

Figure 17:
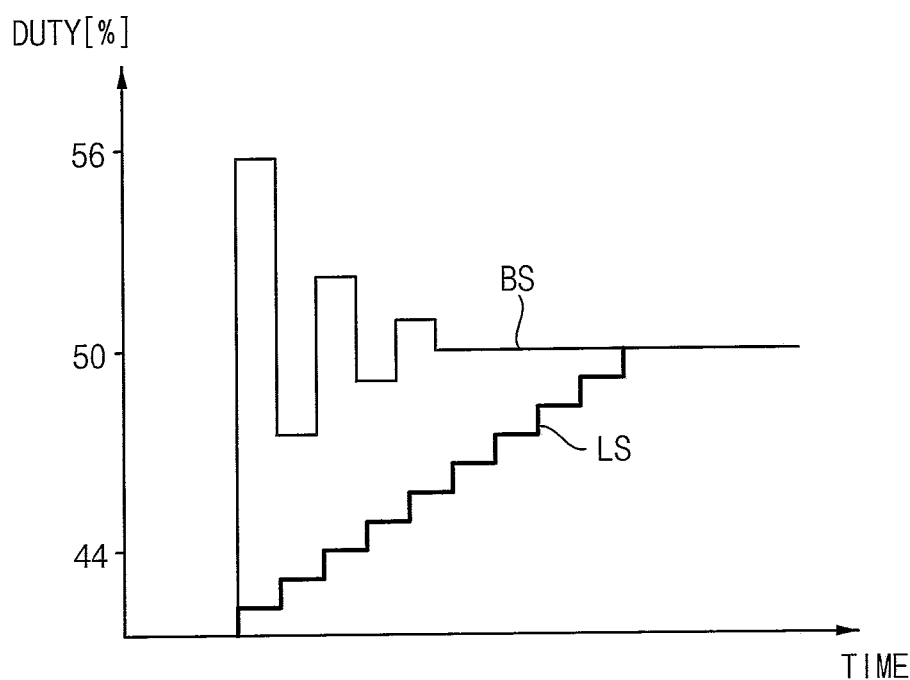
FIG. 17 illustrates that the code generator in FIG. 16 generates the second control code set based on a binary search or a linear search.

FIG. 17 illustrates that the code generator in FIG. 16 generates the second control code set based on a binary search or a linear search.

Referring to FIGS. 16 and 17, the code generator 471a may generate the second control code set DCC2 based on a binary search BS using a successive approximate register or a linear search LS and may store optimal values of the second control code set DCC2 in the code storage 471b. When the code generator 471a generates the second control code set DCC2 based on the binary search BS, the code generator 471a may select a most significant bit (MSB) from which the binary search is started.

The register set 470 in FIG. 7 may include a second register circuit to search optimal values of the third control code set DCC3.

Figure 18:
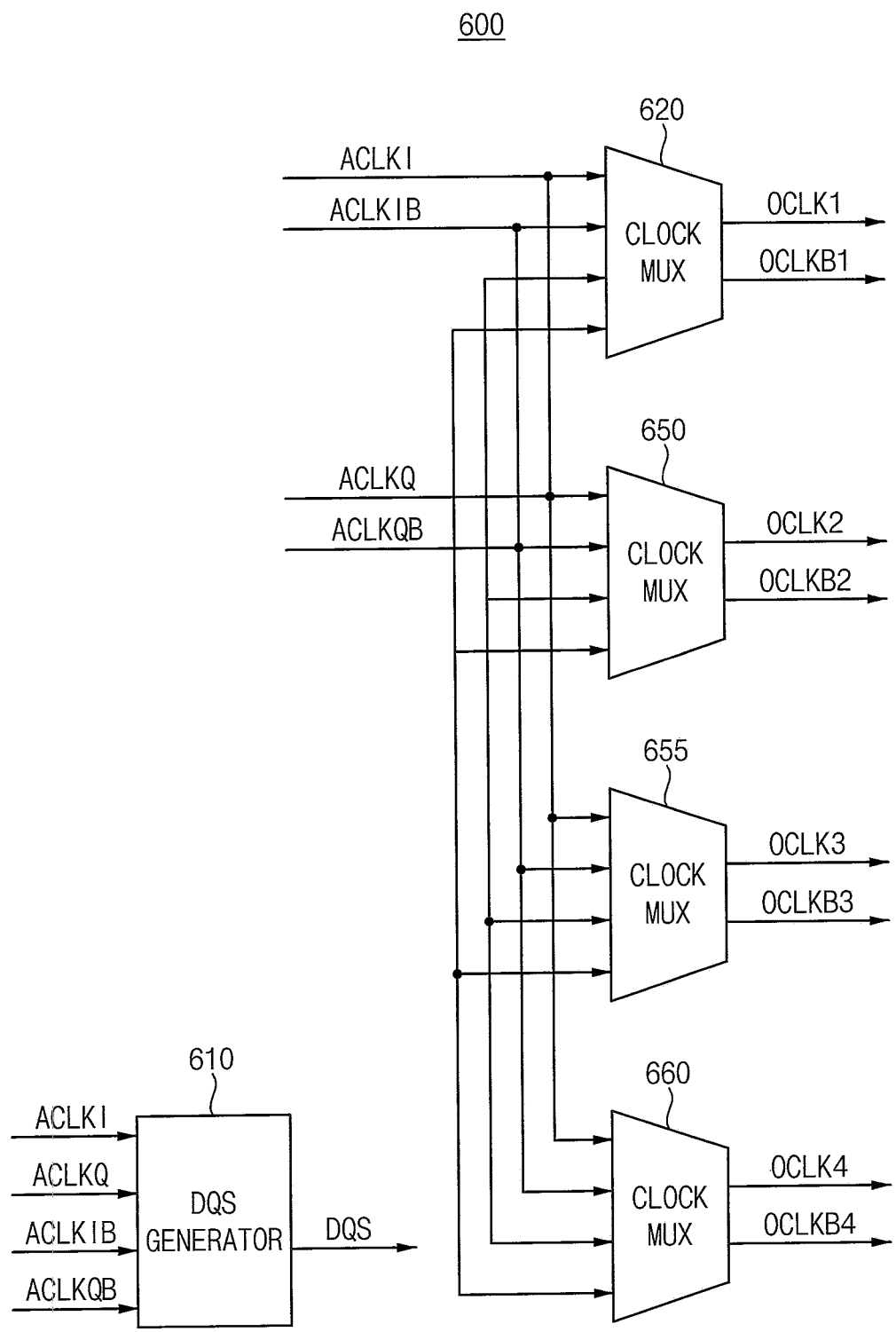
FIG. 18 is a block diagram illustrating an example of the clock generation circuit in the semiconductor memory device of FIG. 2 according to example embodiments.

FIG. 18 is a block diagram illustrating an example of the clock generation circuit in the semiconductor memory device of FIG. 2 according to example embodiments.

Referring to FIG. 18, the clock generation circuit 600 may include a strobe signal (DQS) generator 610 and first through fourth clock multiplexers 620, 650, 655 and 660.

The strobe signal generator 610 may generate the strobe signal DQS based on the first through fourth adjusted clock signals ACLKI, ACLKQ, ACLKIB and ACLKQB.

Each of the first through fourth clock multiplexers 620, 650, 655 and 660 may receive the first through fourth adjusted clock signals ACLKI, ACLKQ, ACLKIB and ACLKQB and may generate the first through fourth output clock signal pairs OCLK1 and OCLKB1, OCLK2 and OCLKB2, OCLK3 and OCLKB3 and OCLK4 and OCLKB4 by combining the first through fourth adjusted clock signals ACLKI, ACLKQ, ACLKIB and ACLKQB.

Figure 19:
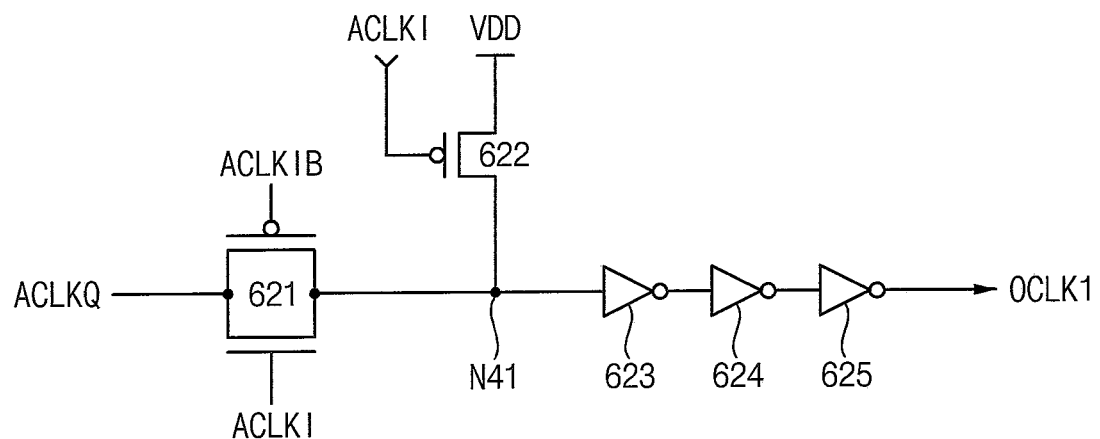
FIG. 19 is a circuit diagram illustrating an example of the first clock multiplexer in the clock generation circuit of FIG. 18 according to example embodiments.
Figure 19:
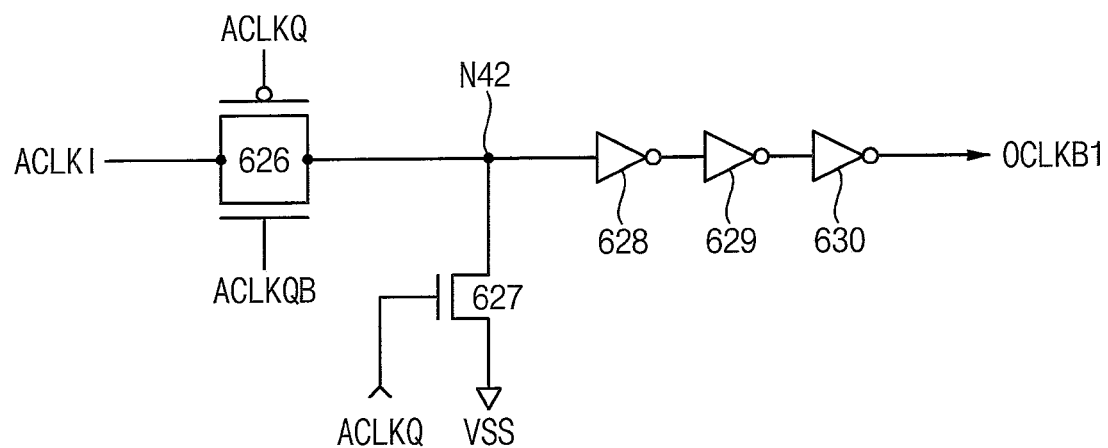

FIG. 19 is a circuit diagram illustrating an example of the first clock multiplexer in the clock generation circuit of FIG. 18 according to example embodiments.

Referring to FIG. 19, the first clock multiplexer 620 may include a transmission gate 621, a PMOS transistor 622, inverters 623, 624 and 625, a transmission gate 626, an NMOS transistor 627 and inverters 628, 629 and 630.

The transmission gate 621 may transfer the second adjusted clock signal ACLKQ to a node N41 based on the first adjusted clock signal ACLKI and the third adjusted clock signal ACLKIB. The PMOS transistor 622 is connected between the power supply voltage VDD and the node N41 and has a gate to receive the first adjusted clock signal ACLKI. The PMOS transistor 622 precharges the node N41 to a level of the power supply voltage VDD in response to the first adjusted clock signal ACLKI. The inverters 623, 624 and 625 invert a level of the node N41 three times to provide a first output clock signal OCLK1.

The transmission gate 626 may transfer the first adjusted clock signal ACLKI to a node N42 based on the second adjusted clock signal ACLKQ and the fourth adjusted clock signal ACLKQB. The NMOS transistor 627 is connected between the node N42 and the ground voltage VSS and has a gate to receive the second adjusted clock signal ACLK. The NMOS transistor 627 discharges the node N42 to a level of the ground voltage VSS in response to the second adjusted clock signal ACLKQ. The inverters 628, 629 and 630 invert a level of the node N42 three times to provide a first inverted output clock signal OCLKB1.

Each of the second through fourth clock multiplexers 650, 655 and 660 in FIG. 18 may have a same configuration as the clock multiplexer 620 of FIG. 19.

Figure 20:
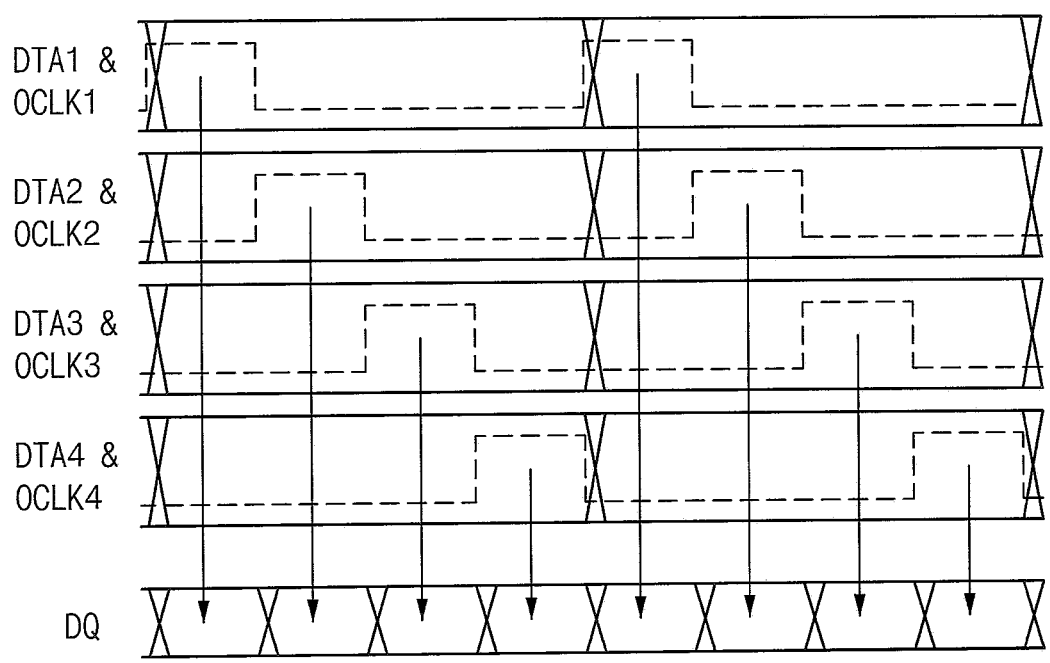
FIG. 20 illustrates data signal output from the data I/O buffer based on the output clock signals in FIG. 5.

FIG. 20 illustrates data signal output from the data I/O buffer based on the output clock signals in FIG. 5.

Referring to FIG. 20, the data output circuit 340 in FIG. 5 may output the data signal DQ by sampling a first bit DTA1 of the data DTA based on the first output clock signal OCLK1, by sampling a second bit DTA2 of the data DTA based on the second output clock signal OCLK2, by sampling a third bit DTA3 of the data DTA based on the third output clock signal OCLK3 and by sampling a fourth bit DTA4 of the data DTA based on the fourth output clock signal OCLK4. Therefore, a toggling frequency of the data signal DQ may be greater than a toggling frequency of each of the first through fourth output clock signals OCLK1, OCLK2, OCLK3 and OCLK4.

Figure 21:
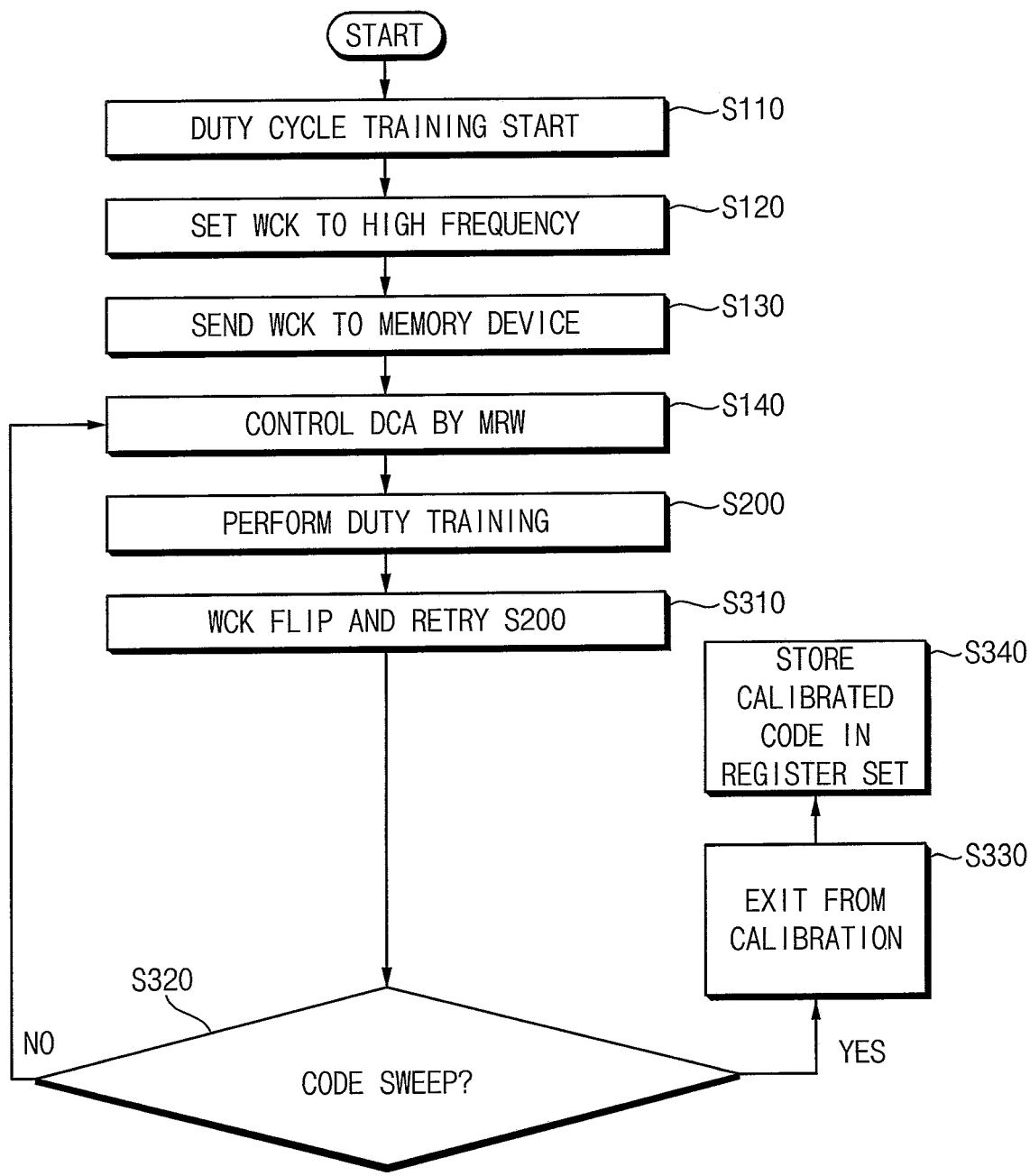
FIG. 21 is a flow chart illustrating a method of duty training of a semiconductor memory device according to example embodiments.

FIG. 21 is a flow chart illustrating a method of duty training of a semiconductor memory device according to example embodiments.

Referring to FIGS. 1 through 21, a duty cycle training starts when the memory controller 100 applies a duty training command to the semiconductor memory device 200 (operation S110).

The memory controller 100 sets the data clock signal WCK to a high frequency (operation S120), and provides the data clock signal WCK to the semiconductor memory device 200 (operation S130). The memory controller 100 may control operation of the duty cycle adjuster 410 by writing the first control code set DCC1 in the mode register set 212 in FIG. 2 (operation S140).

The clock correction circuit 400 performs the above mentioned duty training (operation S200). The clock correction circuit 400 may generate first through fourth divided clock signals which have a phase difference of 90 degrees with respect to each other based on the data clock signal WCK, may generate first through fourth adjusted clock signals ACLKI, ACLKQ, ACLKIB and ACLKQB by adjusting skew of each of the first through fourth divided clock signals, and may perform sequentially a first duty cycle training to search a second control code set, a second duty cycle training to search a third control code set and a third duty cycle training to search the first control code set during a duty training interval tDCMM. The second control code set may be associated with the first divided clock signal and the third divided clock signal, the third control code set may be associated with the second divided clock signal and the fourth divided clock signal, and the first control code set may be associated with the first divided clock signal and the second divided clock signal.

The memory controller 100 may change the frequency of the data clock signal WCK and the clock correction circuit 400 may perform the operation of S200 again (operation S310).

The clock correction circuit 400 determines whether codes of the control code sets are swept (operation S320). When the codes of the control code sets are not swept (NO in operation S320), the duty training returns to the operation S140. When the codes of the control code sets are swept (YES in operation S320), the clock correction circuit 400 exits from the duty training mode (operation S330), stores the second control code set DCC2 and the third control code set DCC3 in the registers set 470 (operation S340) and transmits the first control code DCC1 to the memory controller 100.

Figure 22:
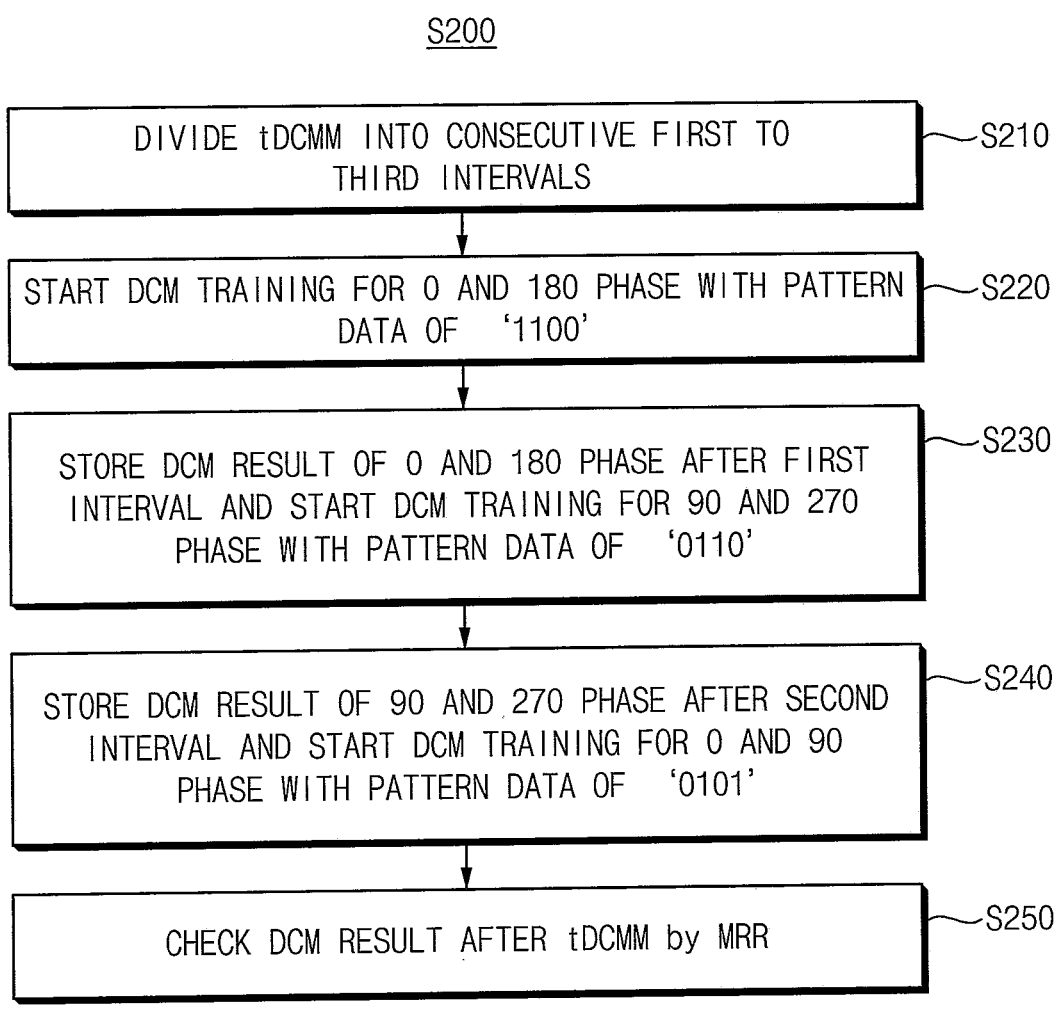
FIG. 22 is a flow chart illustrating an example of performing duty training in FIG. 21 according to example embodiments.

FIG. 22 is a flow chart illustrating an example of performing duty training in FIG. 21 according to example embodiments.

Referring to FIGS. 1 through 22, for performing the duty training (operation S200), the training scheduler 463 divides the duty training interval tDCMM into the first interval INT1, the second interval INT2 and the third interval INT3 which are consecutive (operation S210).

The clock multiplexer 457 selects the first adjusted clock signal ACLKI and the third adjusted clock signal ACLKIB in response to the rising edge and the falling edge of the first pattern data PTD1 corresponding to '1100' from the multi pattern generator 460 during the first interval and the duty cycle monitor 465 generates the monitoring information MT_INF by monitoring duties of the first adjusted clock signal ACLKI and the third adjusted clock signal ACLKIB (operation S220).

The register set 140 stores the monitoring information MT_INF associated with the first adjusted clock signal ACLKI and the third adjusted clock signal ACLKIB after end of the first interval, the clock multiplexer 457 selects the second adjusted clock signal ACLKQ and the fourth adjusted clock signal ACLKQB in response to the rising edge and the falling edge of the second pattern data PTD2 corresponding to '0110' from the multi pattern generator 460 during the second interval and the duty cycle monitor 465 generates the monitoring information MT_INF by monitoring duties of the second adjusted clock signal ACLKQ and the fourth adjusted clock signal ACLKQB (operation S230).

The register set 140 stores the monitoring information MT_INF associated with the second adjusted clock signal ACLKQ and the fourth adjusted clock signal ACLKQB after end of the second interval, the clock multiplexer 457 selects the first adjusted clock signal ACLKI and the second adjusted clock signal ACLKQ in response to the rising edge and the falling edge of the third pattern data PTD3 corresponding to '0101' from the multi pattern generator 460 during the third interval and the duty cycle monitor 465 generates the monitoring information MT_INF by monitoring duties of the first adjusted clock signal ACLKI and the second adjusted clock signal ACLKQ (operation S240).

The flip-flop 475 transmits the monitoring information MT_INF associated with the first adjusted clock signal ACLKI and the second adjusted clock signal ACLKQ to the memory controller 100, and the memory controller 100 checks the duties of the first adjusted clock signal ACLKI and the second adjusted clock signal ACLKQ. In addition, the memory controller reads the register set 470 (denoted by MRR) after end of the duty training interval tDCMM and checks a result of the duty training stored in the register set 470 (operation S250).

Figure 23:
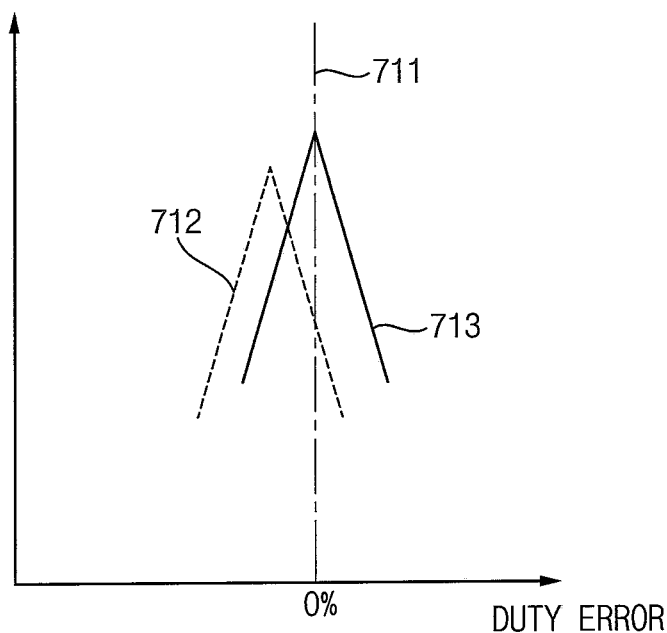
FIG. 23 is a graph illustrating effect of the duty training in the semiconductor memory device according to example embodiments.

FIG. 23 is a graph illustrating effects of the duty training in the semiconductor memory device according to example embodiments.

In FIG. 23, a horizontal axis denotes a duty error and vertical axis denotes an eye size of a clock signal. In addition, a reference numeral 711 denotes a point in which the duty error is zero, a reference numeral 712 denotes an eye size of a clock signal when a duty error of a first clock signal and a second clock signal having a phase difference of 90 degrees is corrected, and a reference numeral 713 denotes an eye size of the adjusted clock signal when duty error and phase skew of the data clock signal is corrected according to example embodiments.

Referring to FIG. 23, it is noted that signal integrity is enhanced when the skew error and the duty error of the clock signals are corrected according to example embodiments.

Figure 24:
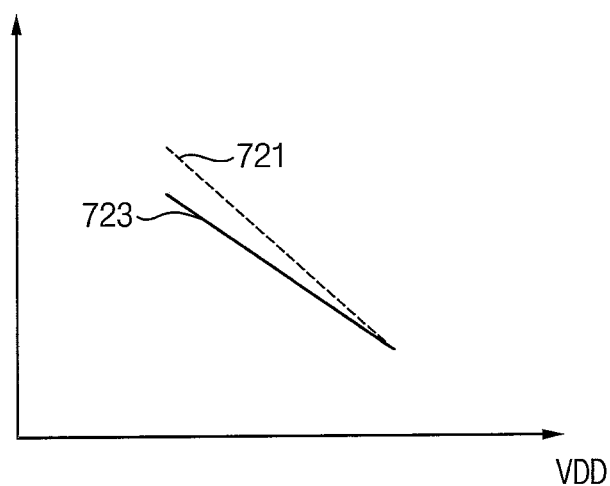
FIG. 24 is a graph illustrating effect of the duty training in the semiconductor memory device according to example embodiments.

FIG. 24 is a graph illustrating effects of the duty training in the semiconductor memory device according to example embodiments.

In FIG. 24, a horizontal axis denotes a voltage level of the power supply voltage VDD and vertical axis denotes a phase skew of the clock signals. In addition, a reference numeral 721 denotes a phase skew of a clock signal when duty error of a first clock signal and a second clock signal having a phase difference of 90 degrees is corrected and a reference numeral 723 denotes a phase skew of adjusted clock signal when duty error and the phase skew of the data clock signal is corrected according to example embodiments.

Referring to FIG. 24, it is noted that the phase skew is reduced in response to the voltage level of the power supply voltage VDD increasing when the skew error and the duty error of the clock signals are corrected according to example embodiments.

Figure 25:
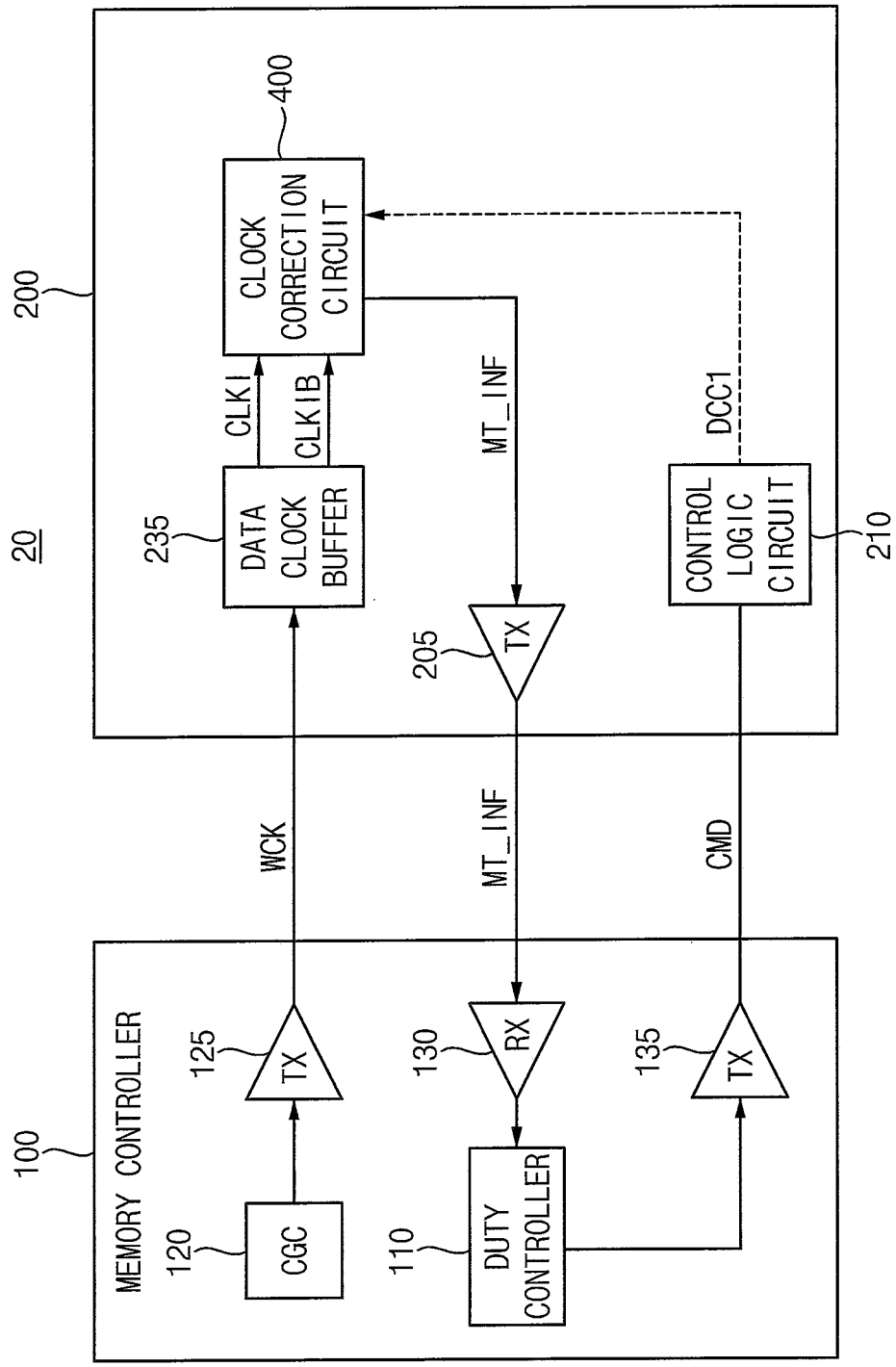
FIG. 25 is a block diagram illustrating the memory system of FIG. 1 according to example embodiments.

FIG. 25 is a block diagram illustrating the memory system of FIG. 1 according to example embodiments.

FIG. 25 illustrates components associated with the duty cycle training operation.

Referring to FIG. 25, the memory controller 100 may include a clock generator 120, a transmitter 125, a receiver 130, the duty controller 110 and a transmitter 135.

The clock generator 120 may generate the data clock signal WCK and the transmitter 125 may transmit the data clock signal WCK to the semiconductor memory device 200. The receiver 130 may receive the monitoring information MT_INF from the semiconductor memory device 200. The duty controller 110 may receive the monitoring information MT_INF from the receiver 130, may update the first control code set based on the monitoring information MT_INF and may transmit the command CMD including the updated first control code set to the semiconductor memory device 200 through the transmitter 135.

The semiconductor memory device 200 may include the control logic circuit 210, the data clock buffer 235, the clock correction circuit 400 and a transmitter 205.

The data clock buffer 235 may generate the first clock signal CLKI and the second clock signal CLKIB based on the data clock signal WCK, and the clock correction circuit 400 may generate first through fourth divided clock signals which have a phase difference of 90 degrees with respect to each other based on the first clock signal CLKI and the second clock signal CLKIB or based the data clock signal WCK, may generate first through fourth adjusted clock signals by adjusting skew of each of the first through fourth divided clock signals, may perform sequentially a first duty cycle training to search a second control code set, a second duty cycle training to search a third control code set and a third duty cycle training to search the first control code set DCC1 during a duty training interval based on a duty training command received from the memory controller 100, and may provide the first control code set DCC1 to the memory controller 100 through the transmitter 205 after end of the duty training interval. The second control code set may be associated with the first divided clock signal and the third divided clock signal, the third control code set may be associated with the second divided clock signal and the fourth divided clock signal, and the first control code set being associated with the first divided clock signal and the second divided clock signal.

The control logic circuit 210 may include a mode register set and the mode register set may store the first control code set DCC1 and the updated first control code set.

Figure 26:
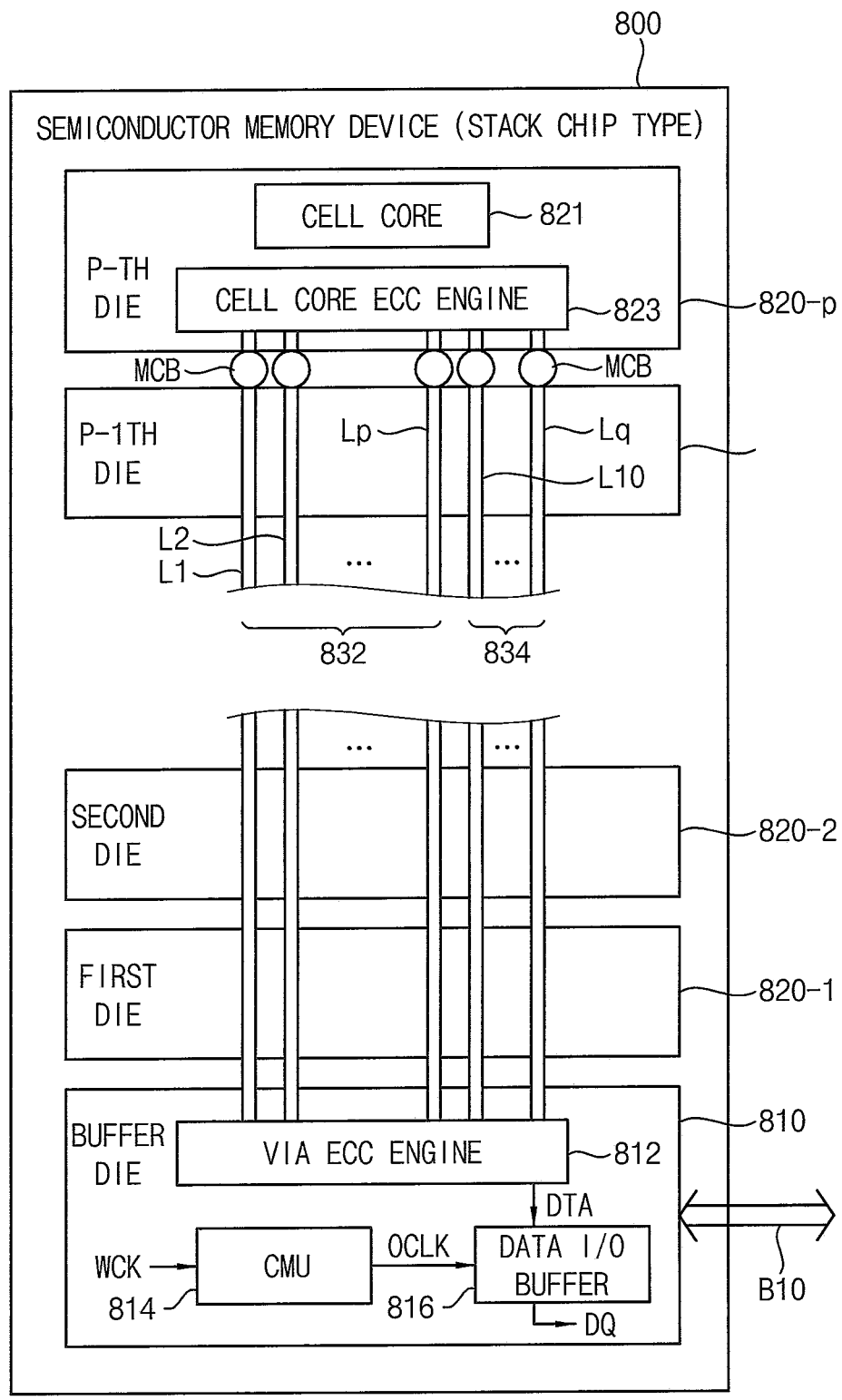
FIG. 26 is a block diagram illustrating a semiconductor memory device according to example embodiments.

FIG. 26 is a block diagram illustrating a semiconductor memory device according to example embodiments.

Referring to FIG. 26, a semiconductor memory device 800 may include at least one buffer die 810 and a plurality of memory dies 820-1 to 820-p (p is a natural number equal to or greater than three) providing a soft error analyzing and correcting function in a stacked chip structure.

The plurality of memory dies 820-1 to 820-p are stacked on the buffer die 810 and conveys data through a plurality of through silicon via (TSV) lines.

At least one of the memory dies 820-1 to 820-p may include a memory core to store data and a cell core ECC engine 823 which generates transmission parity bits (i.e., transmission parity data) based on transmission data to be sent to the at least one buffer die 810. The cell core 821 may include a plurality of memory cells having DRAM cell structure.

The buffer die 810 may include a via ECC engine 812 which corrects a transmission error using the transmission parity bits when a transmission error is detected from the transmission data received through the TSV liens and generates error-corrected data.

The buffer die 810 may further include a clock management unit (CMU) 814 and a data I/O buffer 816. The CMU 814 may employ the clock correction circuit 400 of FIG. 4 and the clock generation circuit 600 of FIG. 18, may generate adjusted clock signals whose phase skews are corrected based on the data clock signal WCK and may generate the output clock signal OCLK based on the adjusted clock signals. The data I/O buffer 816 may generate the data signal DQ by sampling the data DTA from the via ECC engine 812 and may output the data signal DQ to an outside (e.g., to an external device).

The semiconductor memory device 800 may be a stack chip type memory device or a stacked memory device which conveys data and control signals through the TSV lines. The TSV lines may be also called 'through electrodes'.

The cell core ECC engine 823 may perform error correction on data which is output from the memory die 820-*p* before the transmission data is sent.

A data TSV line group 832 which is formed at one memory die 820-*p* may include 128 TSV lines L1 to Lp, and a parity TSV line group 834 may include 8 TSV lines L10 to Lq. The TSV lines L1 to Lp of the data TSV line group 832 and the parity TSV lines L10 to Lq of the parity TSV line group 834 may be connected to micro bumps MCB which are correspondingly formed among the memory dies 820-1 to 820-*p*.

The semiconductor memory device 800 may have a three-dimensional (3D) chip structure or a 2.5D chip structure to communicate with the host through a data bus B10. The buffer die 810 may be connected with the memory controller through the data bus B10.

According to example embodiments, as illustrated in FIG. 26, the cell core ECC engine 823 may be included in the memory die, the via ECC engine 812 may be included in the buffer die. Accordingly, it may be possible to detect and correct soft data fail. The soft data fail may include a transmission error which is generated due to noise when data is transmitted through TSV lines.

Figure 27:
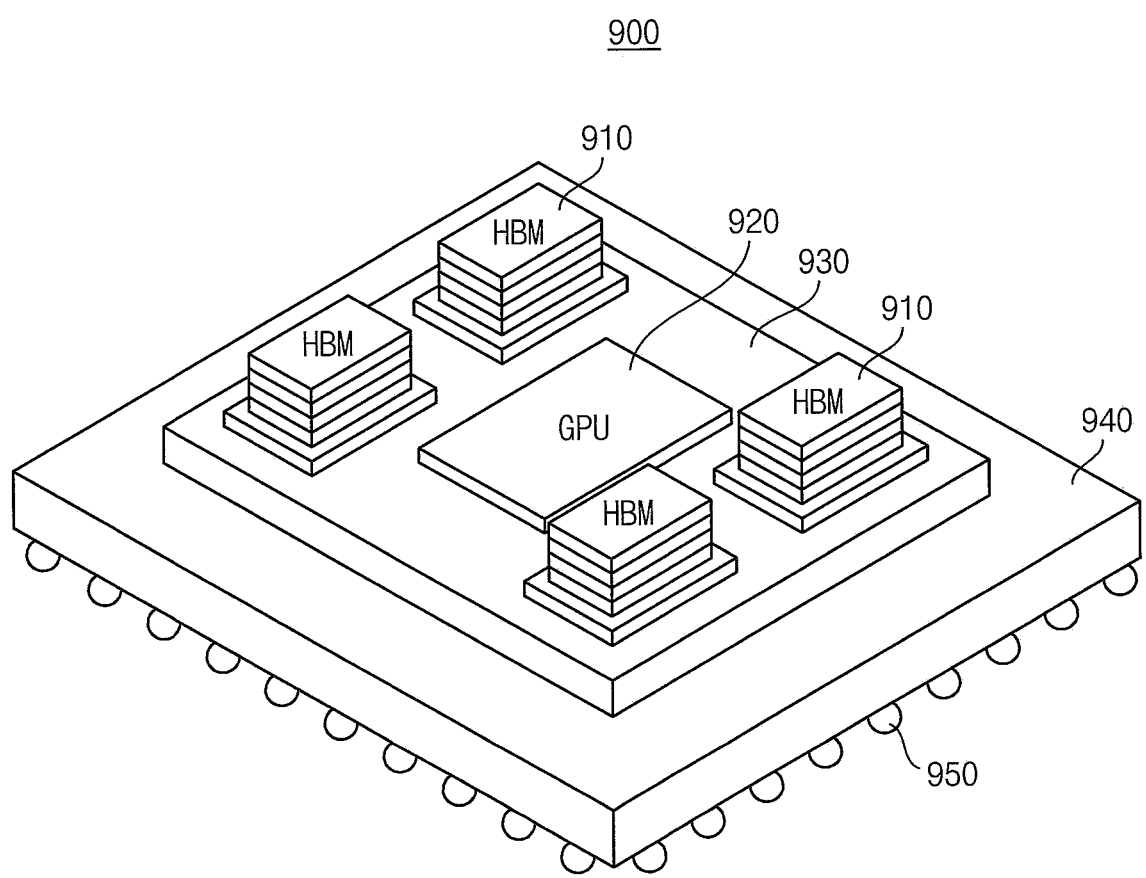
FIG. 27 is a configuration diagram illustrating a semiconductor package including the stacked memory device according to example embodiments.

FIG. 27 is a configuration diagram illustrating a semiconductor package including the stacked memory device according to example embodiments.

Referring to FIG. 27, a semiconductor package 900 may include one or more stacked memory devices 910 and a graphic processing unit (GPU) 920.

The stacked memory devices 910 and the GPU 920 may be mounted on an interposer 930, and the interposer on which the stacked memory device 910 and the GPU 920 are mounted may be mounted on a package substrate 940 mounted on solder balls 950.

The GPU 920 may correspond to a semiconductor device which may perform a memory control function, and for example, the GPU 920 may be implemented as an application processor (AP).

The stacked memory device 910 may be implemented in various forms, and the stacked memory device 910 may be a memory device in a high bandwidth memory (HBM) form in which a plurality of layers are stacked. Accordingly, the stacked memory device 910 may include a buffer die and a plurality of memory dies and the buffer die may include the above-mentioned clock correction circuit and a clock generation circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. Meanwhile, when the stacked memory device 910 includes a direct access region, a test signal may be provided into the stacked memory device 910 through conductive means (e.g., solder balls 950) mounted under package substrate 940 and the direct access region.

Aspects of the present inventive concept may be applied to systems using semiconductor memory devices that employ volatile memory cells and data clock signals. For example, aspects of the present inventive concept may be applied to systems such as a smart phone, a navigation system, a notebook computer, a desk top computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims.

What is claimed is:

1. A semiconductor memory device comprising:
   a mode register set configured to store a first control code set received from a memory controller and configured to set an operation mode of the semiconductor memory device; and
   a clock correction circuit configured to:
   generate first, second, third, and fourth divided clock signals, which have a phase difference of 90 degrees with respect to each other, based on a data clock signal received from the memory controller;
   generate first second, third, and fourth adjusted clock signals by adjusting skew of each of the first, second, third, and fourth divided clock signals; and
   sequentially perform a first duty cycle training to search a second control code set, a second duty cycle training to search a third control code set, and a third duty cycle training to search the first control code set, during a duty training interval based on a duty training command received from the memory controller,
   wherein the second control code set is associated with the first divided clock signal and the third divided clock signal,
   wherein the third control code set is associated with the second divided clock signal and the fourth divided clock signal, and
   wherein the first control code set is associated with the first divided clock signal and the second divided clock signal.

2. The semiconductor memory device of claim 1, further comprising:
   a clock generation circuit configured to generate an output clock signal and a strobe signal based on the first, second, third, and fourth adjusted clock signals which are generated based on the first, second and third control code sets searched after the duty training interval; and
   a data input/output (I/O) buffer configured to generate a data signal by sampling data from a memory cell array based on the output clock signal and configured to transmit the data signal and the strobe signal to the memory controller,
   wherein the clock correction circuit is configured to store the second control code set and the third control code set that were searched in a register set therein and is configured to transmit the first control code set that was searched to the memory controller, and
   wherein the memory controller is configured to update the first control code set based on the first control code set that was searched and is configured to store the first control code set that was updated in the mode register set.

3. The semiconductor memory device of claim 2, wherein, after the duty training interval, the clock correction circuit is configured to:

adjust a phase skew of each of the first divided clock signal and the third divided clock signal based on the second control code set stored in the register set; and adjust a phase skew of each of the second divided clock signal and the fourth divided clock signal based on the third control code set stored in the register set.

4. The semiconductor memory device of claim 1, wherein the clock correction circuit is configured to perform the first duty cycle training and the second duty cycle training hidden to the memory controller.

5. The semiconductor memory device of claim 1, wherein the clock correction circuit comprises:

a duty cycle adjuster configured to generate a first corrected clock signal and a second corrected clock signal, which have a phase difference of 180 degrees with respect to each other, by correcting a duty error of the data clock signal including a pair of differential clock signals based on the first control code set;

a clock division circuit configured to divide the first corrected clock signal to generate the first divided clock signal and the third divided clock signal having a phase difference of 180 degrees with respect to each other, and configured to divide the second corrected clock signal to generate the second divided clock signal and the fourth divided clock signal having a phase difference of 180 degrees with respect to each other;

a training scheduler configured to divide the duty training interval into a first interval, a second interval, and a third interval, which are consecutive, and configured to generate training control signals during which a duty training signal based on the duty training command is activated;

a phase skew adjusting circuit configured to generate the first, second, third, and fourth adjusted clock signals by adjusting the first, second, third, and fourth divided clock signals during the duty training interval;

a multi pattern generator configured to generate a first pattern data during the first interval, configured to generate a second pattern data during the second interval, and configured to generate a third pattern data during the third interval, based on a pattern generation control signal in the training control signals;

a clock multiplexer configured to provide the first adjusted clock signal and the third adjusted clock signal as a first selected clock signal and a second selected clock signal from among the first, second, third, and fourth adjusted clock signals based on the first pattern data during the first interval, configured to provide the second adjusted clock signal and the fourth adjusted clock signal as the first selected clock signal and the second selected clock signal from among the first, second, third, and fourth adjusted clock signals based on the second pattern data during the second interval, and configured to provide the first adjusted clock signal and the second adjusted clock signal as the first selected clock signal and the second selected clock signal from among the first, second, third, and fourth adjusted clock signals based on the third pattern data during the third interval;

a duty cycle monitor configured to monitor duty cycles of the first selected clock signal and the second selected clock signal in each of the first interval, the second interval, and the third interval, and configured to generate monitoring information based on a result of monitoring the duty cycles;

a demultiplexer;

a register set configured to store the second control code set and the third control code set which are searched based on the monitoring information during the duty training interval; and a flip-flop, wherein the demultiplexer is configured to provide the monitoring information to the register set in the first interval, and is configured to provide the monitoring information to the memory controller through the flip-flop in the second interval, based on a first selection signal in the training control signals.

6. The semiconductor memory device of claim 5, wherein the first pattern data comprises logic levels corresponding to '1100' during two periods of the data clock signal, and wherein the clock multiplexer is configured to select the first adjusted clock signal and the third adjusted clock signal from among the first, second, third, and fourth adjusted clock signals in response to each of a rising edge and a falling edge of the first pattern data during the first interval.

7. The semiconductor memory device of claim 5, wherein the second pattern data comprises logic levels corresponding to '0110' during two periods of the data clock signal, and wherein the clock multiplexer is configured to select the second adjusted clock signal and the fourth adjusted clock signal from among the first, second, third, and fourth adjusted clock signals in response to each of a rising edge and a falling edge of the second pattern data during the second interval.

8. The semiconductor memory device of claim 5, wherein the third pattern data comprises logic levels corresponding to '0101' during two periods of the data clock signal, and wherein the clock multiplexer is configured to select the first adjusted clock signal and the second adjusted clock signal from among the first, second, third, and fourth adjusted clock signals in response to each of a rising edge and a falling edge of the third pattern data during the third interval.

9. The semiconductor memory device of claim 5, wherein the duty cycle adjuster is configured to:

correct a duty error of the data clock signal during the duty training interval based on the first control code set received from the memory controller and stored in the mode register set; and correct the duty error of the data clock signal after the duty training interval based on an updated first control code set received from the memory controller.

10. The semiconductor memory device of claim 5, wherein the duty cycle adjuster comprises:

a p-channel metal-oxide semiconductor (PMOS) transistor connected between a power supply voltage and a first node and comprising a gate configured to receive a first enable signal;

a current source connected between the first node and a second node;

a second PMOS transistor connected between the second node and a third node and comprising a gate configured to receive a first data clock signal of the pair of differential clock signals;

a plurality of third PMOS transistors connected to the second node in parallel with the second PMOS transistor, each of the plurality of third PMOS transistors comprising a gate configured to receive the first data clock signal;

a plurality of fourth PMOS transistors, each of the plurality of fourth PMOS transistors connected between respective one of the plurality of third PMOS transistors and the third node and comprising a gate configured to receive respective bit of the first control code set;

a fifth PMOS transistor connected between the second node and a fourth node and comprising a gate configured to receive a second data clock signal of the pair of differential clock signals;

a plurality of sixth PMOS transistors connected to the second node in parallel with the fifth PMOS transistor, each of the plurality of sixth PMOS transistors comprising a gate configured to receive the second data clock signal;

a plurality of seventh PMOS transistors, each of the plurality of seventh PMOS transistors connected between a respective one of the plurality of sixth PMOS transistors and the fourth node and comprising a gate configured to receive a respective bit of a first inverted control code set obtained by inverting the first control code set;

a first resistor connected between the third node and a fifth node;

a second resistor connected between the fourth node and the fifth node; and a n-channel metal-oxide semiconductor (NMOS) transistor connected between the fifth node and a ground voltage and comprising a gate configured to receive a second enable signal, wherein the first and second enable signals are complementary.

11. The semiconductor memory device of claim 10, wherein the duty cycle adjuster is configured to provide the first corrected clock signal at the third node and is configured to provide the second corrected clock signal at the fourth node, wherein each of the plurality of fourth PMOS transistors is configured to be selectively turned-on in response to the respective bit of the first control code set to adjust a duty cycle of the first data clock signal, and wherein each of the plurality of seventh PMOS transistors is configured to be selectively turned-on in response to the respective bit of the first inverted control code set to adjust a duty cycle of the second data clock signal.

12. The semiconductor memory device of claim 5, wherein the phase skew adjusting circuit comprises first, second, third, and fourth phase skew adjusters, and wherein, after the duty training interval:

the first phase skew adjuster is configured to provide the first adjusted clock signal by adjusting a phase skew of the first divided clock signal based on the second control code set stored in the register set;

the second phase skew adjuster is configured to provide the third adjusted clock signal by adjusting a phase skew of the third divided clock signal based on the second control code set stored in the register set;

the third phase skew adjuster is configured to provide the second adjusted clock signal by adjusting a phase skew of the second divided clock signal based on the third control code set stored in the register set; and the fourth phase skew adjuster is configured to provide the fourth adjusted clock signal by adjusting a phase skew of the fourth divided clock signal based on the third control code set stored in the register set.

13. The semiconductor memory device of claim 12, wherein the first phase skew adjuster comprises:

a first stage configured to provide an intermediate clock signal by adjusting a slew rate of a rising edge of the first divided clock signal based on the second control code set; and a second stage configured to provide the first adjusted clock signal by adjusting a slew rate of a falling edge of the intermediate clock signal based on a second inverted control code set obtained by inverting the second control code set.

14. The semiconductor memory device of claim 13, wherein the first stage comprises:

a first unit cell connected between a power supply voltage and a ground voltage; and a plurality of second unit cells connected between the power supply voltage and the ground voltage in parallel with the first unit cell, wherein the second stage comprises:

a third unit cell connected between the power supply voltage and the ground voltage; and a plurality of fourth unit cells connected between the power supply voltage and the ground voltage in parallel with the third unit cell.

15. The semiconductor memory device of claim 14, wherein the first unit cell comprises a first p-channel metal-oxide semiconductor (PMOS) transistor and a first n-channel metal-oxide semiconductor (NMOS) transistor connected in series between the power supply voltage and the ground voltage, wherein each gate of the first PMOS transistor and the first NMOS transistor is configured to receive the first divided clock signal, wherein each of the plurality of second unit cells comprises a second PMOS transistor, a third PMOS transistor, a second NMOS transistor, and a third NMOS transistor connected in series between the power supply voltage and the ground voltage, wherein each gate of the second PMOS transistor and the third NMOS transistor is configured to receive the first divided clock signal, and wherein each gate of the third PMOS transistor and the second NMOS transistor is configured to receive a corresponding bit of the second control code set.

16. The semiconductor memory device of claim 14, wherein the third unit cell comprises a first p-channel metal-oxide semiconductor (PMOS) transistor and a first n-channel metal-oxide semiconductor (NMOS) transistor connected in series between the power supply voltage and the ground voltage, wherein each gate of the first PMOS transistor and the first NMOS transistor is configured to receive the intermediate clock signal, wherein each of the plurality of fourth unit cells comprises a second PMOS transistor, a third PMOS transistor, a second NMOS transistor, and a third NMOS transistor connected in series between the power supply voltage and the ground voltage, wherein each gate of the second PMOS transistor and the third NMOS transistor is configured to receive the intermediate clock signal, and wherein each gate of the third PMOS transistor and the second NMOS transistor is configured to receive a corresponding bit of a second inverted control code set obtained by inverting the second control code set.

17. The semiconductor memory device of claim 1, wherein the semiconductor memory device comprises a low power double data rate 5 (LPDDR5) synchronous dynamic random access memory (SDRAM) device.

18. A memory system comprising:

a semiconductor memory device; and a memory controller comprising a duty controller, the memory controller configured to control the semiconductor memory device, wherein the semiconductor memory device comprises:

a mode register set configured to store a first control code set received from the duty controller and configured to set an operation mode of the semiconductor memory device; and a clock correction circuit configured to:

generate first, second, third, and fourth divided clock signals, which have a phase difference of 90 degrees with respect to each other, based on a data clock signal received from the memory controller;

generate first, second, third, and fourth adjusted clock signals by adjusting skew of each of the first, second, third, and fourth divided clock signals; and sequentially perform a first duty cycle training to search a second control code set, a second duty cycle training to search a third control code set, and a third duty cycle training to search the first control code set, during a duty training interval based on a duty training command received from the memory controller, wherein the second control code set is associated with the first divided clock signal and the third divided clock signal, wherein the third control code set is associated with the second divided clock signal and the fourth divided clock signal, and wherein the first control code set is associated with the first divided clock signal and the second divided clock signal.

19. The memory system of claim 18, wherein the clock correction circuit is configured to store the second control code set and the third control code set that were searched in a register set therein and is configured to transmit the first control code set that was searched to the duty controller, and wherein the duty controller is configured to update the first control code set based on the first control code set that was searched and is configured to store the updated first control code set in the mode register set.

20. A semiconductor memory device comprising:

a mode register set configured to store a first control code set received from a memory controller and configured to set an operation mode of the semiconductor memory device; and a clock correction circuit configured to:

generate first, second, third, and fourth divided clock signals, which have a phase difference of 90 degrees with respect to each other, based on a data clock signal received from the memory controller; and sequentially perform a first duty cycle training to search a second control code set, a second duty cycle training to search a third control code set, and a third duty cycle training to search the first control code set, during a duty training interval based on a duty training command received from the memory controller, wherein the second control code set is associated with the first divided clock signal and the third divided clock signal, wherein the third control code set is associated with the second divided clock signal and the fourth divided clock signal, and wherein the first control code set is associated with the first divided clock signal and the second divided clock signal, wherein the clock correction circuit comprises:

a training scheduler configured to divide the duty training interval into a first interval, a second interval and a third interval, which are consecutive, and configured to generate training control signals during which a duty training signal based on the duty training command is activated;

a phase skew adjusting circuit configured to generate first, second, third, and fourth adjusted clock signals by adjusting skew of each of the first, second, third, and fourth divided clock signals during the duty training interval;

a multi pattern generator configured to generate first pattern data during the first interval, second pattern data during the second interval, and third pattern data during the third interval, based on a pattern generation control signal in the training control signals;

a clock multiplexer configured to provide the first adjusted clock signal and the third adjusted clock signal as a first selected clock signal and a second selected clock signal from among the first, second, third, and fourth adjusted clock signals based on the first pattern data during the first interval, configured to provide the second adjusted clock signal and the fourth adjusted clock signal as the first selected clock signal and the second selected clock signal from among the first, second, third, and fourth adjusted clock signals based on the second pattern data during the second interval, and configured to provide the first adjusted clock signal and the second adjusted clock signal as the first selected clock signal and the second selected clock signal from among the first, second, third, and fourth adjusted clock signals based on the third pattern data during the third interval;

a duty cycle monitor configured to monitor duty cycles of the first selected clock signal and the second selected clock signal in each of the first interval, the second interval, and the third interval, and configured to generate monitoring information based on a result of the monitoring;

a demultiplexer;

a register set; and a flip-flop, wherein the demultiplexer is configured to provide the monitoring information to the register set in the first interval, and is configured to provide the monitoring information to the memory controller through the flip-flop in the second interval, based on a first selection signal in the training control signals.

* * * * *